US012610514B2

(12) United States Patent
Liu et al.

(10) Patent No.: US 12,610,514 B2
(45) Date of Patent: Apr. 21, 2026

(54) MEMORY DEVICE AND METHOD OF MANUFACTURING MEMORY DEVICE

(71) Applicants: Beijing Superstring Academy of Memory Technology, Beijing (CN); INSTITUTE OF MICROELECTRONICS, CHINESE ACADEMY OF SCIENCES, Beijing (CN)

(72) Inventors: Ziyi Liu, Beijing (CN); Huilong Zhu, Poughkeepsie, NY (US)

(73) Assignees: Beijing Superstring Academy of Memory Technology, Beijing (CN); INSTITUTE OF MIRCOELECTRONICS, CHINESE ACADEMY OF SCIENCES, Beijing (CN)

( * ) Notice: Subject to any disclaimer, the term of this patent is extended or adjusted under 35 U.S.C. 154(b) by 474 days.

(21) Appl. No.: 18/256,669

(22) PCT Filed: Dec. 14, 2021

(86) PCT No.: PCT/CN2021/137861
§ 371 (c)(1),
(2) Date: Jun. 9, 2023

(87) PCT Pub. No.: WO2023/102964
PCT Pub. Date: Jun. 15, 2023

(65) Prior Publication Data
US 2024/0114672 A1 Apr. 4, 2024

(30) Foreign Application Priority Data
Dec. 10, 2021 (CN) .......................... 202111514469.3

(51) Int. Cl.
*H10B 10/00* (2023.01)

(52) U.S. Cl.
CPC .................................. *H10B 10/125* (2023.02)

(58) Field of Classification Search
None
See application file for complete search history.

(56) References Cited

U.S. PATENT DOCUMENTS

| | | | |
|---|---|---|---|
| 6,903,411 | B1 | 6/2005 | Chyan et al. |
| 7,138,685 | B2 | 11/2006 | Hsu et al. |

(Continued)

FOREIGN PATENT DOCUMENTS

| | | | |
|---|---|---|---|
| CN | 1507035 | A | 6/2004 |
| CN | 106206600 | A | 12/2016 |

(Continued)

OTHER PUBLICATIONS

English translation of CN 106298792 B (Year: 2019).*

(Continued)

*Primary Examiner* — Khaja Ahmad
(74) *Attorney, Agent, or Firm* — Westman, Champlin & Koehler, P.A.

(57) ABSTRACT

A memory device includes a memory unit array on substrate, the memory unit array includes a plurality of memory units, each memory unit includes: a left and a right stack arranged at intervals in a horizontal direction. The left stack and right stacks each include a lower isolation layer, PMOS layer, first NMOS layer, upper isolation layer and second NMOS layer stacked on the substrate sequentially. The PMOS layer, and the first and second NMOS layers each include first source/drain layer, channel layer and second source/drain layer vertically stacked. The channel layer is laterally recessed relative to the first and second source/drain layers; and a gate stack between the first and second source/drain layers in the (Continued)

Single storage unit vertical direction, and disposed on opposite sides of the channel layer and embedded into a lateral recess of the channel layer.

17 Claims, 33 Drawing Sheets

(56) References Cited

U.S. PATENT DOCUMENTS

| | | | |
|---|---|---|---|
| 9,881,998 | B1 | 1/2018 | Cheng et al. |
| 10,784,344 | B2 | 9/2020 | Song et al. |
| 10,978,470 | B2 | 4/2021 | Zhu |
| 11,222,949 | B2 | 1/2022 | Song et al. |
| 11,257,824 | B1 | 2/2022 | Yang |
| 11,735,629 | B2 | 8/2023 | Song et al. |
| 11,737,255 | B2 | 8/2023 | Yang |
| 2002/0132441 | A1 | 9/2002 | Trivedi et al. |
| 2004/0113207 | A1 | 6/2004 | Hsu et al. |
| 2007/0007601 | A1 | 1/2007 | Hsu et al. |
| 2019/0096996 | A1 | 3/2019 | Song et al. |
| 2020/0027897 | A1* | 1/2020 | Zhu ........................ H10B 43/27 |
| 2020/0381514 | A1 | 12/2020 | Song et al. |
| 2021/0249419 | A1* | 8/2021 | Chang .................. H10D 62/118 |
| 2021/0305263 | A1* | 9/2021 | Tomita ................... H10B 10/12 |
| 2021/0335796 | A1 | 10/2021 | Chang et al. |
| 2022/0037336 | A1 | 2/2022 | Yang |
| 2022/0093735 | A1 | 3/2022 | Song et al. |
| 2022/0173113 | A1 | 6/2022 | Yang |
| 2023/0363133 | A1 | 11/2023 | Yang |

FOREIGN PATENT DOCUMENTS

| | | | | |
|---|---|---|---|---|
| CN | 106298792 | A | 1/2017 | |
| CN | 106340521 | A | 1/2017 | |
| CN | 109003982 | A | 12/2018 | |
| CN | 109585559 | A | 4/2019 | |
| CN | 106298792 | B * | 7/2019 | ............ H10B 43/27 |
| CN | 113764421 | A | 12/2021 | |

OTHER PUBLICATIONS

International Search Report and Written Opinion for International Application No. PCT/CN2021/137861, dated Jul. 29, 2022, 11 pages.
First Chinese Office Action for corresponding Chinese Application No. CN 202111514469.3, dated Oct. 15, 2024, 5 pages.
Guo Hao, "Design of the Vertical U-Shaped Gate TFET with Sandwich Layer", School of Microelectronics, University of Science and Technology of China, Hefei, China, (C) 1994-2023 China Academic Journal Electronic Publishing House. All rights reserved. http://www.cnki.net, Aug. 2021, 7 pages. English Abstract only.

* cited by examiner

3001

2012

2002

2002

3002

2013

1001

1009

A        A'

C        C'

B        B'

2003

MEMORY DEVICE AND METHOD OF MANUFACTURING MEMORY DEVICE

CROSS REFERENCE TO RELATED APPLICATION

This application is a Section 371 National Stage Application of International Application No. PCT/CN2021/137861, filed on Dec. 14, 2021, entitled "MEMORY DEVICE AND METHOD OF MANUFACTURING MEMORY DEVICE", which claims priority to Chinese Application No. 202111514469.3, filed on Dec. 10, 2021, the contents of which are incorporated herein by reference in their entireties.

TECHNICAL FIELD

The present disclosure relates to a field of semiconductor, and in particular, to a memory device and a method of manufacturing a memory device.

BACKGROUND

With a continuous miniaturization of a semiconductor device, it is increasingly difficult to manufacture a high-density interconnection structure because it is difficult to reduce a dimension in a lateral direction. In addition, in order to increase an integration level, multilayer devices may be stacked. Based on this, it is desired to provide an interconnection for such stacked devices in a flexible manner.

SUMMARY

In view of the above, an objective of the present disclosure is at least in part to provide a memory device capable of reducing a standby leakage without increasing a device threshold voltage and a method of manufacturing the same.

According to an aspect of the present disclosure, there is provided a memory device, including: a substrate; a memory unit array on the substrate, wherein the memory unit array includes a plurality of memory units, wherein each of the memory units includes: a left stack and a right stack arranged at an interval in a horizontal direction, wherein each of the left stack and the right stack includes a lower isolation layer, a PMOS layer, a first NMOS layer, an upper isolation layer and a second NMOS layer stacked on the substrate sequentially, each of the PMOS layer, the first NMOS layer and the second NMOS layer includes a first source/drain layer, a channel layer and a second source/drain layer vertically stacked, and the channel layer is laterally recessed with respect to the first source/drain layer and the second source/drain layer; and a gate stack between the first source/drain layer and the second source/drain layer in a vertical direction, and disposed on opposite sides of the channel layer to be embedded into a lateral recess of the channel layer.

According to another aspect of the present disclosure, there is provided a method of manufacturing a memory device, including: forming a left stack and a right stack on a substrate arranged at an interval in a horizontal direction, wherein each of the left stack and the right stack includes a lower isolation layer, a PMOS layer, a first NMOS layer, an upper isolation layer and a second NMOS layer stacked sequentially, each of the PMOS layer, the first NMOS layer and the second NMOS layer includes a first source/drain layer, a channel layer and a second source/drain layer vertically stacked, and the channel layer is laterally recessed with respect to the first source/drain layer and the second source/drain layer; sequentially depositing a gate dielectric layer and a p-type gate conductor layer on a lateral recess of the channel layer; depositing $SiO_2$ at a bottom of the left stack and the right stack, and etching the $SiO_2$ and stopping at a first preset height to form a first spacing portion; etching the p-type gate conductor layer on corresponding positions of the first NMOS layer and the second NMOS layer, and depositing a n-type gate conductor layer on corresponding positions of the etched p-type gate conductor layer; and etching the first spacing portion to form a memory unit, wherein the memory device includes a memory unit array having a plurality of memory units.

According to another aspect of the present disclosure, there is provided an electronic device including the memory device described above.

BRIEF DESCRIPTION OF THE DRAWINGS

The above and other objectives, features and advantages of the present disclosure will be more apparent through the following description of embodiments of the present disclosure with reference to the accompanying drawings.

FIG. 2 to FIG. 29 schematically show sectional views in different stages in sequence of a method of manufacturing a memory device according to embodiments of the present disclosure.

FIG. 2 schematically shows a sectional view of a stack formed on a substrate.

FIG. 4 (b) shows a sectional view along line AA' formed according to FIG. 4(a).

FIG. 6 (b) shows a sectional view along line 11' formed according to FIG. 6(a).

FIG. 7 schematically shows a sectional view along line AA'.

FIG. 8 schematically shows a sectional view along line AA'.

FIG. 9 schematically shows a sectional view along line AA'.

FIG. 10 schematically shows a sectional view along line AA'.

FIG. 11 schematically shows a sectional view along line AA'.

FIG. 12 schematically shows a sectional view along line AA'.

FIG. 13 schematically shows a sectional view along line AA'.

FIG. 14 schematically shows a sectional view along line AA'.

FIG. 15 schematically shows a sectional view along line AA'.

FIG. 16 schematically shows a sectional view along line AA'.

FIG. 20 schematically shows a sectional view along line AA'.

FIG. 22 schematically shows a sectional view along line AA'.

FIG. 24 schematically shows a sectional view along line BB'.

FIG. 25 schematically shows a sectional view along line BB'.

FIG. 26 schematically shows a sectional view along line BB'.

FIG. 29 schematically shows a sectional view along line BB'.

SYMBOL DESCRIPTION

Figure 1:
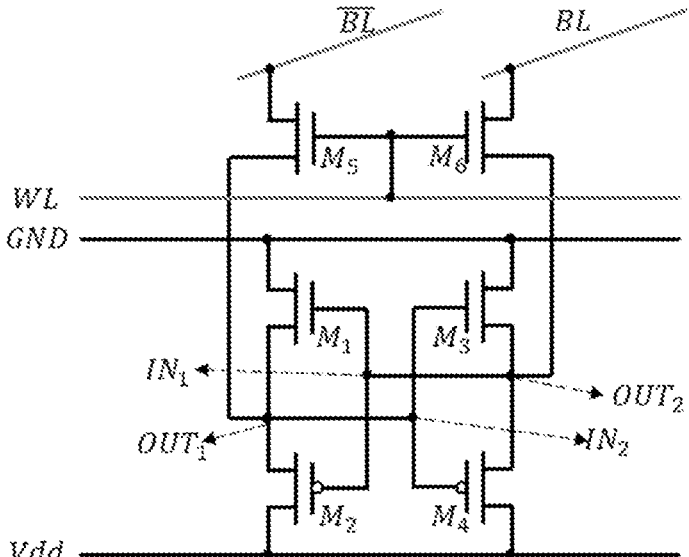
FIG. 1 schematically shows a circuit schematic diagram of a 6T SRAM unit.

1001—substrate; 10021—lower isolation layer; 10022—upper isolation layer;

10031/10032/10033—first source/drain layer; 10051/10052/10053—channel defining layer;

10071/10072/10073—second source/drain layer; 1009—hard mask layer;

2001—first SiC layer; 2002—second SiC layer; 2003—third SiC layer;

2004—fourth SiC layer; 2011—first $SiO_2$ layer; 2012—second $SiO_2$ layer;

2013—third $SiO_2$ layer; 2014—fourth $SiO_2$ layer; 2015—fifth $SiO_2$ layer;

2016—sixth $SiO_2$ layer; 2017—seventh $SiO_2$ layer; 2018—eighth $SiO_2$ layer;

3001—first epitaxial layer; 3002—second epitaxial layer; 4001—gate dielectric layer;

4002—p-type gate conductor layer; 4003—n-type gate conductor layer; 200 channel layer;

301—first spacing portion; 302—second spacing portion; 5001—first metal layer;

5002—second metal layer; 5003—third metal layer; 5004—fourth metal layer;

5005—fifth metal layer; 6001—first contact portion; 6002—second contact portion.

Throughout the accompanying drawings, same or similar reference signs represent same or similar components. The accompanying drawings are not necessarily drawn to scale, and especially for the sake of clarity, the drawing scale of sectional views is different from the drawing scale of top views.

DETAILED DESCRIPTION OF EMBODIMENTS

Embodiments of the present disclosure will be described below with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to embodiments of the present disclosure are shown in the accompanying drawings. The drawings are not drawn to scale. Some details are enlarged and some details may be omitted for clarity of presentation. Shapes of various regions and layers as well as the relative size and positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

The present disclosure may be presented in various forms, some examples of which will be described below. In the following descriptions, a selection of various materials is involved. In the selection of materials, in addition to a function of the material (for example, a semiconductor material may be used to form an active region, and a dielectric material may be used to form an electrical isolation), an etching selectivity is also considered. In the following descriptions, a required etching selectivity may or may not be indicated. It should be clear to those skilled in the art that when it is mentioned below that a material layer is etched, if it is not mentioned or shown that other layers are also etched, then the etching may be selective, and the material layer may have an etching selectivity relative to other layers exposed to a same etching recipe.

FIG. 1 schematically shows a circuit schematic diagram of a 6T SRAM unit.

As shown in FIG. 1, the 6T SRAM unit includes transistor M1 to transistor M6. In FIG. 1, G represents a gate electrode of the transistor, S represents a source electrode of the transistor, and D represents a drain electrode of the transistor. Both the source electrode of transistor M2 and the source electrode of transistor M4 are connected to a power supply Vdd, the source electrode of transistor M1 and the source electrode of transistor M3 are grounded to GND, the drain electrode of transistor M1 is connected to the drain electrode of transistor M2, and the drain electrode of transistor M3 is connected to the drain electrode of transistor M4. The gate electrode of transistor M1 and the gate electrode of transistor M2 are connected to the drain electrode of transistor M3, and the gate electrode of transistor M3 and the gate electrode of transistor M4 are connected to the drain electrode of transistor M1.

The gate electrode of transistor M5 and the gate electrode of transistor M6 are connected with a word line (WL), and the drain electrode of transistor M5 is connected with a bit line $\overline{BL}$, the drain electrode of transistor M6 is connected with a bit line (BL), the bit line BL and the bit line $\overline{BL}$ are mutually opposite signals. The source electrode of transistor M5 is connected to the drain electrode of transistor M1, and the source electrode of transistor M6 is connected to the drain electrode of transistor M3.

Therefore, the 6T SRAM unit is the minimum unit, wherein transistor M1 and transistor M3 are NMOS (N-Metal-Oxide-Semiconductor) transistors, transistor M2 and transistor M4 are PMOS (positive channel Metal Oxide Semiconductor) transistors, and transistor M5 and transistor M6 are transmission gate NMOS transistors. Transistor M1 and transistor M2 form a first CMOS (Complementary Metal Oxide Semiconductor), and transistor M3 and transistor M4 form a second CMOS.

In order to facilitate internal and external data exchange, the drain electrodes of transistor M1 and transistor M2 are connected to an instrument to form an output node OUT1 of the first CMOS, and the drain electrodes of transistor M3 and transistor M4 are connected to the instrument to form an output node OUT2 of the second CMOS. The gate electrodes of transistor M1 and transistor M2 are connected together to form an input node IN1 of the first CMOS, and the gate electrodes of transistor M3 and transistor M4 are connected together to form an input node IN2 of the second CMOS.

The 6T SRAM unit has been described in detail above. The memory device provided in embodiments of the present disclosure below uses a 6T SRAM unit as the minimum memory unit, which has fewer transistors, simplifies a storage and processing structure of a computer, saves a computing resource, and improves a computing progress and a computing efficiency simultaneously.

The memory device provided in embodiments of the present disclosure includes: a substrate; a memory unit array on the substrate, wherein the memory unit array includes a plurality of memory units, wherein each of the memory units includes: a left stack and a right stack arranged at an interval in a horizontal direction, wherein each of the left stack and the right stack includes a lower isolation layer, a PMOS layer, a first NMOS layer, an upper isolation layer and a second NMOS layer stacked on the substrate sequentially, each of the PMOS layer, the first NMOS layer and the second NMOS layer includes a first source/drain layer, a channel layer and a second source/drain layer vertically stacked, and the channel layer is laterally recessed with respect to the first source/drain layer and the second source/drain layer; and a gate stack between the first source/drain layer and the second source/drain layer in a vertical direction, and disposed on opposite sides of the channel layer to be embedded into a lateral recess of the channel layer.

According to embodiments of the present disclosure, the memory device further comprises a hard mask layer disposed on the first source/drain layer of the second NMOS layer.

According to embodiments of the present disclosure, the gate stack includes a gate dielectric layer and a gate conductor layer, and the gate dielectric layer includes a work function adjusting metal and a gate conductor metal disposed on the work function adjusting metal.

According to embodiments of the present disclosure, the gate conductor layer includes a p-type gate conductor layer and an n-type gate conductor layer, wherein: the p-type gate conductor layer is disposed between the first source/drain layer and the second source/drain layer of the PMOS layer; the n-type gate conductor layer is disposed between the first source/drain layer and the second source/drain layer of the first NMOS layer, and between the first source/drain layer and the second source/drain layer of the second NMOS layer.

According to embodiments of the present disclosure, lateral outer peripheral parts of the first source/drain layer and the second source/drain layer are recessed and the recessed parts are filled with a third SiC layer; and/or a lateral outer peripheral part of the gate conductor layer is recessed and the recessed part is filled with the third SiC layer.

According to embodiments of the present disclosure, an outer sidewall of the third SiC layer is coplanar with the left stack and the right stack in the vertical direction.

According to embodiments of the present disclosure, the memory device further includes: a fifth $SiO_2$ formed on the substrate between the left stack and the right stack, wherein a top of the fifth $SiO_2$ layer is higher than a bottom of the first source/drain layer of the PMOS layer and lower than a top of the first source/drain layer of the PMOS layer.

According to embodiments of the present disclosure, the memory device further includes: a first metal layer formed on the fifth $SiO_2$ layer at a longitudinal middle position of the left stack and the right stack, wherein a top of the first metal layer is higher than a top of the first source/drain layer of the PMOS layer and lower than a bottom of the second source/drain layer of the PMOS layer.

According to embodiments of the present disclosure, the memory device further includes: a sixth $SiO_2$ layer and a second metal layer sequentially formed on the first metal layer, wherein a top of the sixth $SiO_2$ layer is higher than a top of the first source/drain layer of the first NMOS layer and lower than a bottom of the second source/drain layer of the first NMOS layer; and a top of the second metal layer is higher than a bottom of the second source/drain layer of the first NMOS layer and lower than a top of the second source/drain layer of the first NMOS layer.

According to embodiments of the present disclosure, the memory device further includes: a seventh $SiO_2$ layer formed on the fifth $SiO_2$ layer except the longitudinal middle position, wherein a top of the seventh $SiO_2$ layer is higher than the top of the first source/drain layer of the PMOS layer and lower than the bottom of the second source/drain layer of the PMOS layer.

According to embodiments of the present disclosure, the memory device further includes: a third metal layer formed on the seventh $SiO_2$ layer, wherein a top of the third metal layer is higher than a top of the first source/drain layer of the first NMOS layer and lower than a bottom of the second source/drain layer of the first NMOS layer.

According to embodiments of the present disclosure, the memory device further includes: an fourth SiC layer formed on the third metal layer, wherein a top of the fourth SiC layer is higher than a bottom of the first source/drain layer of the second NMOS layer and lower than a top of the first source/drain layer of the second NMOS layer; and a middle position of the top of the fourth SiC layer is relatively recessed and the third metal layer is exposed to form a second spacing portion separated left and right and having a stepped structure.

According to embodiments of the present disclosure, an inner sidewall and a bottom surface of the second spacing portion are formed with a fourth metal layer higher than the top of the fourth SiC layer; and a top of the fourth metal layer is higher than a bottom of the first source/drain layer of the second NMOS layer and lower than a top of the first source/drain layer of the second NMOS layer.

According to embodiments of the present disclosure, the memory device further includes: a fifth metal layer formed on one of the left stack and the right stack, and in contact with an outer sidewall of the n-type gate conductor layer of the second NMOS layer; a word line connected to the fifth metal layer, wherein the word line bridges the left stack and the right stack at different longitudinal positions on the same memory unit to contact and electrically connect to an outer sidewall of the n-type gate conductor layer in the second NMOS layer of the left stack or the right stack.

According to embodiments of the present disclosure, the memory device further includes: a first contact portion embedded in the second source/drain layer of the second NMOS layer of the left stack, and a second contact portion embedded in the second source/drain layer of the second NMOS layer of the right stack, wherein the first contact portion and the second contact portion are respectively connected to the first bit line and the second bit line having opposite signals to each other.

It should be noted that the embodiment mode of the device part is similar to the embodiment mode of the method part, and the technical effect achieved is also similar. For specific details, please refer to the embodiment mode of the method part, which will not be repeated here.

Embodiments of the present disclosure further provide a method of manufacturing a memory device, including the following steps.

In Step S1, a left stack and a right stack are formed on a substrate at an interval in a horizontal direction, wherein each of the left stack and the right stack includes a lower isolation layer, a PMOS layer, a first NMOS layer, an upper isolation layer and a second NMOS layer stacked sequentially, each of the PMOS layer, the first NMOS layer and the second NMOS layer includes a first source/drain layer, a channel layer and a second source/drain layer vertically stacked, and the channel layer is laterally recessed with respect to the first source/drain layer and the second source/drain layer.

In Step S2, a gate dielectric layer and a p-type gate conductor layer are sequentially deposited on the lateral recess of the channel layer.

In Step S3, $SiO_2$ is deposited at a bottom of the left stack and the right stack, and then the $SiO_2$ is etched and the etching stops at a first preset height to form a first spacing portion.

In Step S4, the p-type gate conductor layer on corresponding positions of the first NMOS layer and the second NMOS layer is etched, and a n-type gate conductor layer is deposited on corresponding positions of the etched p-type gate conductor layer.

In Step S5, the first spacing portion is etched to form a memory unit, wherein the memory device includes a memory unit array of a plurality of memory units.

The method of manufacturing a memory device in embodiments of the present disclosure is described in detail below through FIG. 2 to FIG. 29. FIG. 2 to FIG. 29 schematically show flowcharts in different stages in sequence of a method of manufacturing a memory device according to embodiments of the present disclosure.

Figure 2:
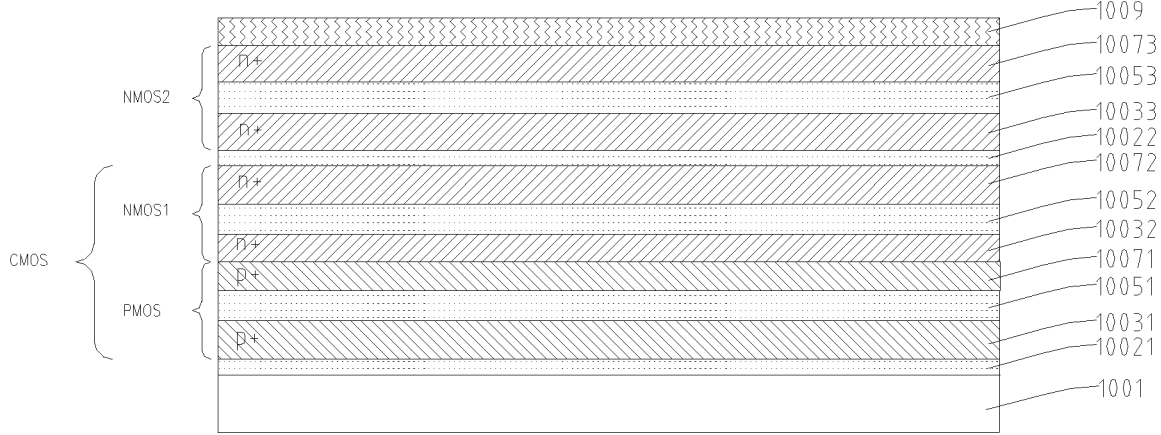

FIG. 2 schematically shows a sectional view of a stack formed on a substrate. As shown in FIG. 2, a substrate 1001 is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following description, for ease of explanation, the bulk Si substrate is illustrated by way of example. Here, a silicon wafer is provided as the substrate 1001.

In the substrate 1001, a well region may be formed. If a p-type device is to be formed, the well region may be an n-type well; and if an n-type device is to be formed, the well region may be a p-type well. Therefore, for example, the p-type well may be formed by injecting a p-type dopant such as boron (B) into the substrate 1001 and then performing a thermal annealing.

On the substrate 1001, a PMOS layer, a first NMOS layer and a second NMOS layer stacked sequentially on the substrate may be formed by epitaxial growth. The PMOS layer is a p-type device, and the first NMOS layer and the second NMOS layer are n-type devices. Those skilled in the art know that the doping of semiconductor materials may be realized by in-situ doping during epitaxial growth, or by other doping methods such as ion implantation. By properly adjusting the doped conductive type, the p-type device or the n-type device may be formed.

The PMOS layer includes the first source/drain layer 10031, the channel defining layer 10051, and the second source/drain layer 10071 vertically stacked sequentially. Similarly, the first NMOS layer includes a first source/drain layer 10032, a channel defining layer 10052, and a second source/drain layer 10072 vertically stacked sequentially. The second NMOS layer includes a first source/drain layer 10033, a channel defining layer 10053, and a second source/drain layer 10073 vertically stacked sequentially. A thickness of the first source/drain layer 10031/10032/10033 is, for example, about 20 nm to 50 nm, a thickness of the channel defining layer 10051/10052/10053 is, for example, about 15 nm to 100 nm, and a thickness of the second source/drain layer 10071/10072/10073 is, for example, about 20 nm to 50 nm.

In order to distinguish different MOS layers, a lower isolation layer 10021 is arranged between the substrate 1001 and the first source/drain layer 10031 of the PMOS layer, and an upper isolation layer 10022 is arranged between the second source/drain layer 10072 of the first NMOS layer and the first source/drain layer 10033 of the second NMOS layer.

Adjacent layers on the above-mentioned substrate 1001 may have etching selectivity with respect to each other. For example, the first source/drain layer 10031/10032/10033 may include Si; the channel defining layer 10051/10052/10053 may be SiGe, and a composition of Ge is about 10% to 20%; the second source/drain layer 10071/10072/10073 may be Si. The upper isolation layer 10022 and the lower isolation layer 10021 may both be SiGe, with a thickness of about 10 nm to 20 nm, and a composition of Ge is about 10% to 20%.

In addition, a hard mask layer 1009 is further deposited on the second source/drain layer 10073 of the second NMOS layer to facilitate patterning. The hard mask layer 1009 may include nitride, such as SiN, with a thickness of about 50 nm to 200 nm.

Figures 3A, 3B:
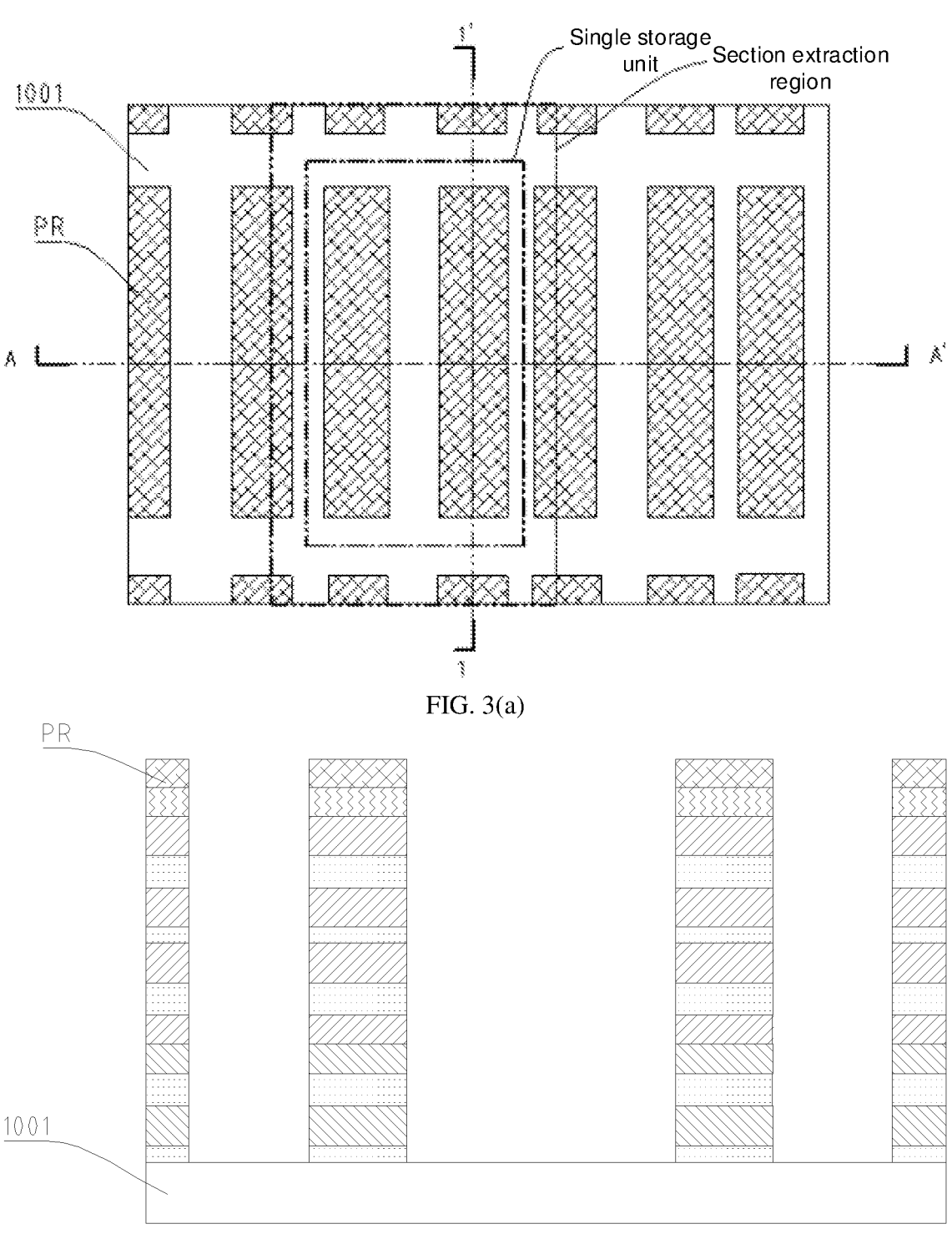
FIG. 3(a) schematically shows a top view of a photoresist patterning region.
FIG. 3(b) shows a sectional view along line AA' formed according to FIG. 3(a).

FIG. 3 (*a*) schematically shows a top view of a photoresist patterning region. FIG. 3 (*b*) shows a sectional view along line AA' formed according to FIG. 3 (*a*).

Then, as shown in FIG. 3 (*a*) and FIG. 3 (*b*), a photoresist is spin-coated on the hard mask layer 1009 and patterned into a region shape of a photolithographic device defined in FIG. 3 (*a*) by exposure, development, and the like. Using the patterned photoresist as a mask, the hard mask layer 1009 is sequentially etched in the vertical direction to an upper surface of the substrate 1001, and then the photoresist is removed.

It should be noted that A-A sectional view in FIG. 3 (*b*) only intercepts the A-A section in the bold double dotted line outer rectangular box region in FIG. 3 (*a*), and the subsequent section AA', section 11', section BB' and section CC' are all the sections intercepted from the bold double dotted line outer rectangular box region in the corresponding top views. The subsequent top view display region is obviously larger than the section interception region, which is just to show an overall shape of a memory array formed by an interconnection of a plurality of minimum SRAM memory units on the top view. The PR (Photoresist) region in FIG. 3 (*a*) represents a region where the photoresist is spin-coated, which is not etched and retains an original stack structure. The dark region represents the region without photoresist, that is, the region where the substrate 1001 is exposed after etching in the top view.

Then, as shown in FIG. 3 (*b*), on a single SRAM memory unit on the section along line AA', a left stack and a right stack arranged at an interval in a horizontal direction are formed after etching, and a section of each stack on the substrate 1001 is formed into a rectangular column. Thus, the corresponding sidewalls of each layer in the stack may be coplanar in the vertical direction.

In addition, only for illustrating a specific structure of the minimum SRAM memory unit, the space left between the left stack and the right stack in the middle position of FIG. 3(*b*) is significantly greater than the space between two adjacent rectangular photoresists in the horizontal direction in FIG. 3(*a*).

Figure 4A:
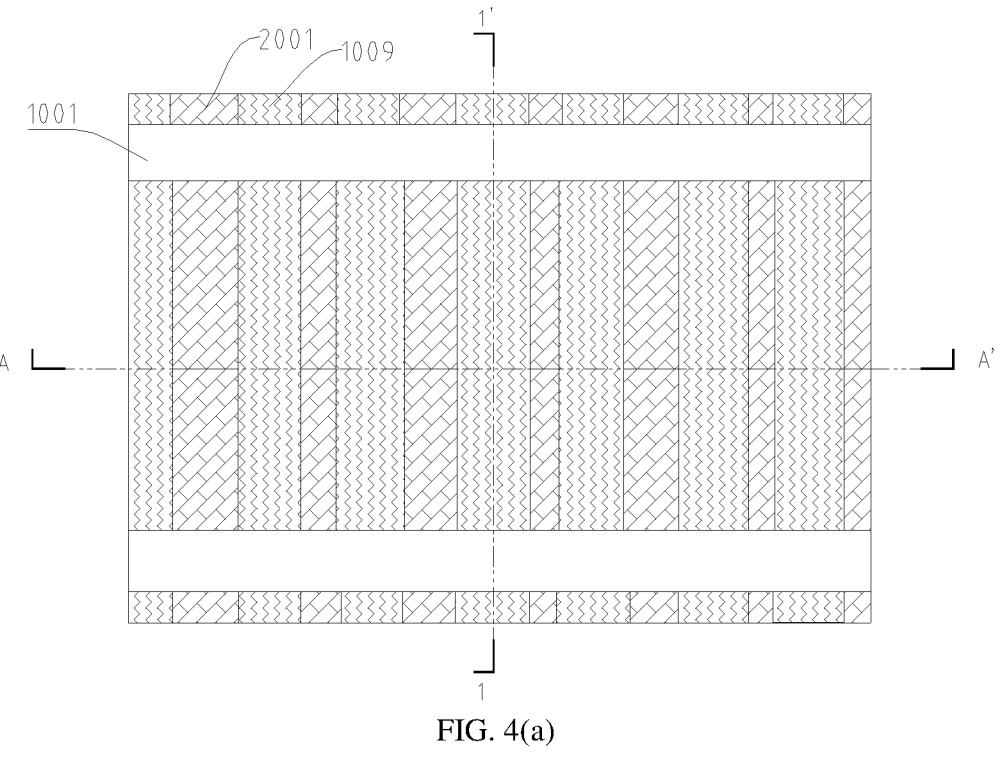
FIG. 4(a) schematically shows a top view of a photoresist patterning region.
Figure 4B:
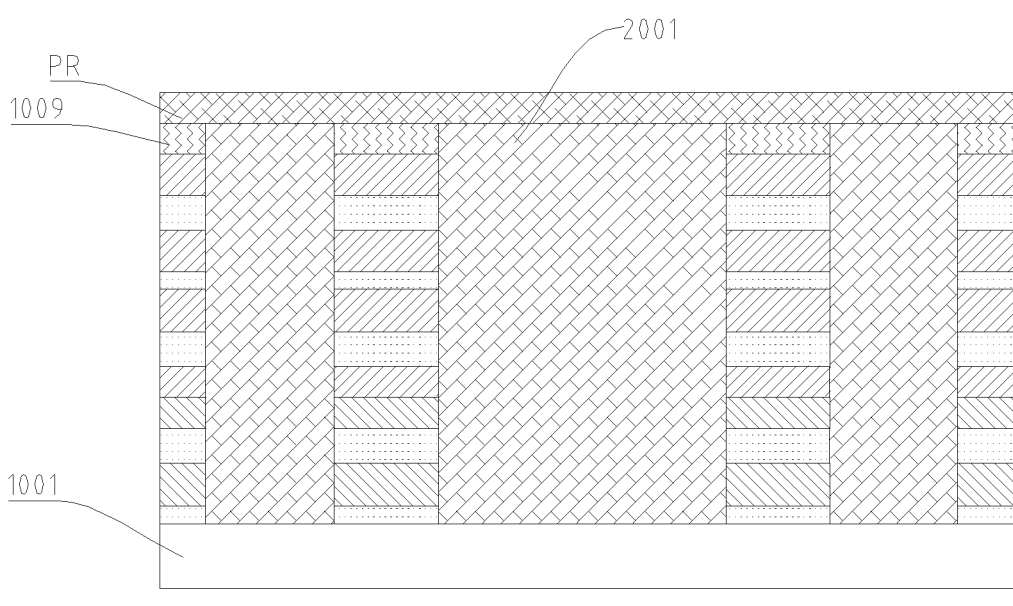

FIG. 4(*a*) schematically shows a top view of a photoresist patterning region. FIG. 4(*b*) shows a sectional view along line AA' formed according to FIG. 4(*a*).

Then, as shown in FIG. 4 (*a*), a first SiC layer 2001 is deposited in a region where an upper lateral stripe, a lower lateral stripe and a plurality of longitudinal stripes in the horizontal direction are located, and a deposition of the first SiC layer 2001 is controlled by Chemical Mechanical Polishing (CMP) to stop on the upper surface of the hard mask layer 1009. Then, except for the upper and lower lateral stripes, the photoresist is spin-coated on other parts, and the first SiC layer 2001 deposited on the upper and lower lateral stripes is etched away from top to bottom, and the etching stops at the upper surface of the substrate 1001. The material of the first SiC layer 2001 is SiC.

Thus, the substrate 1001 is exposed on the upper and lower lateral stripes, and other parts of the previously exposed regions of the substrate 1001 are filled with the first SiC layer 2001.

As shown in FIG. 4 (*b*), on the section AA' and before etching, the hard mask layer 1009 on a top layer of the stack structure and the first SiC layer 2001 are sequentially staggered in the horizontal direction, and upper surfaces of the hard mask layer 1009 and the first SiC layer 2001 are coated with the photoresist.

Figures 5A, 5B:
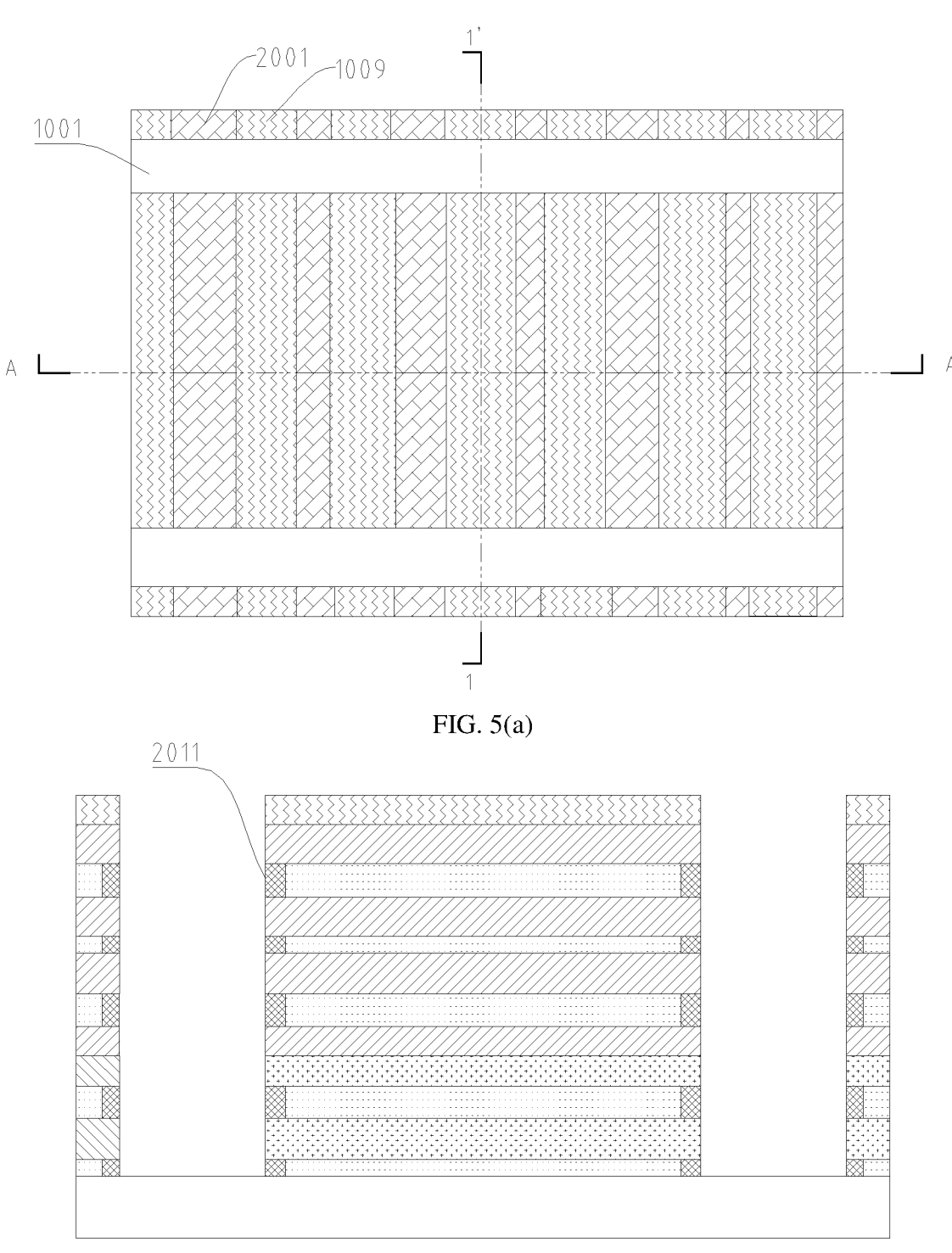
FIG. 5(a) schematically shows a top view of a photoresist patterning region.
FIG. 5(b) shows a sectional view along line 11' formed according to FIG. 5(a).

FIG. 5(*a*) schematically shows a top view of a photoresist patterning region. FIG. 5(*b*) shows a sectional view along line 11' formed according to FIG. 5(*a*).

Then, as shown in FIG. 5(*a*) and FIG. 4(*b*), the photoresist in FIG. 4(*b*) is removed, and corresponding sidewalls of the lower isolation layer 10021, the upper isolation layer 10022, and the channel defining layer 10051/10052/10053 are partially etched in a direction perpendicular to the upper and lower lateral stripes, i.e., the vertical direction. Therefore, the lower isolation layer 10021, the upper isolation layer 10022, and the channel defining layer 10051/10052/10053 form the lateral SiGe grooves as shown in FIG. 5(*b*). The lower isolation layer 10021, the upper isolation layer 10022 and the channel defining layer 10051/10052/10053 may all be SiGe, which is convenient for unified etching.

Then, the first $SiO_2$ layer 2011 is deposited in the lateral SiGe grooves, and the first $SiO_2$ layer 2011 may be etched by Reactive Ion Etching (RIE) such that the first $SiO_2$ layer 2011 fills and occupies the lateral SiGe grooves and the outer sidewall of the first $SiO_2$ layer 2011 and the outer sidewall of the stack are kept in alignment with each other. A material of the first $SiO_2$ layer 2011 is $SiO_2$.

Thus, the lower isolation layer 10021, the upper isolation layer 10022 and the channel defining layer 10051/10052/10053 are respectively etched away by a part, while the other part is retained, wherein the etched part forms a lateral SiGe groove, which is then replaced by the first $SiO_2$ layer 2011.

Figure 6A:
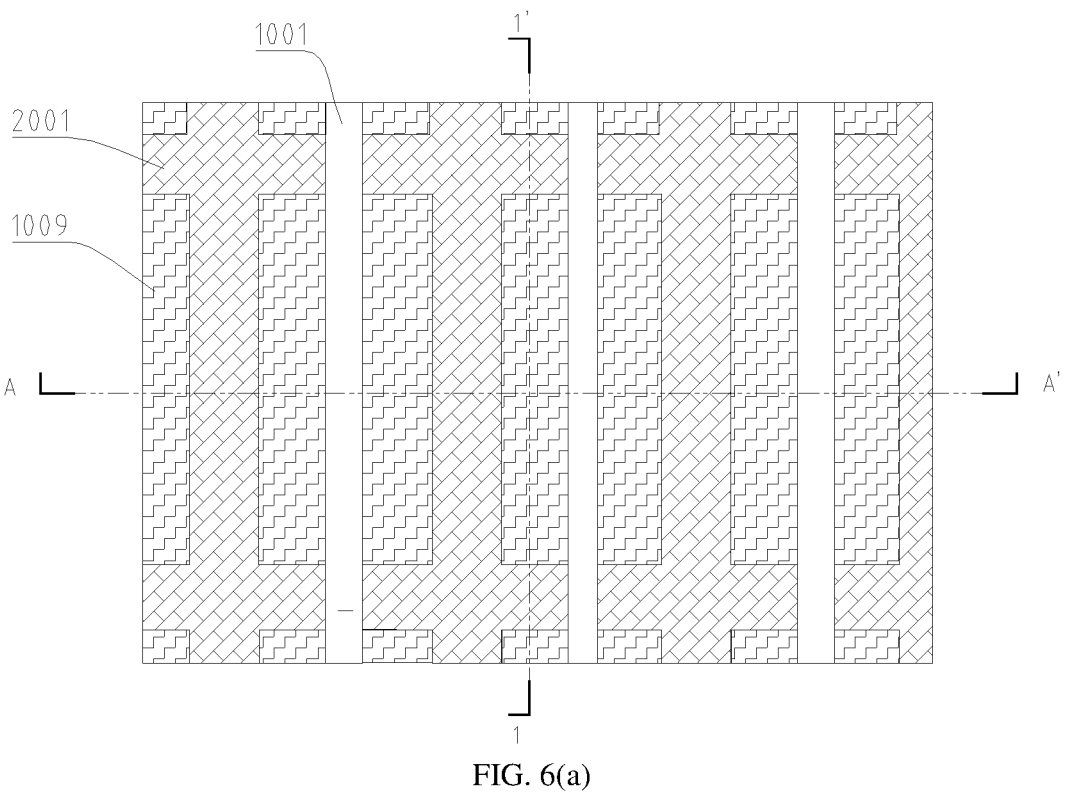
FIG. 6(a) schematically shows a top view of a photoresist patterning region.
Figure 6B:
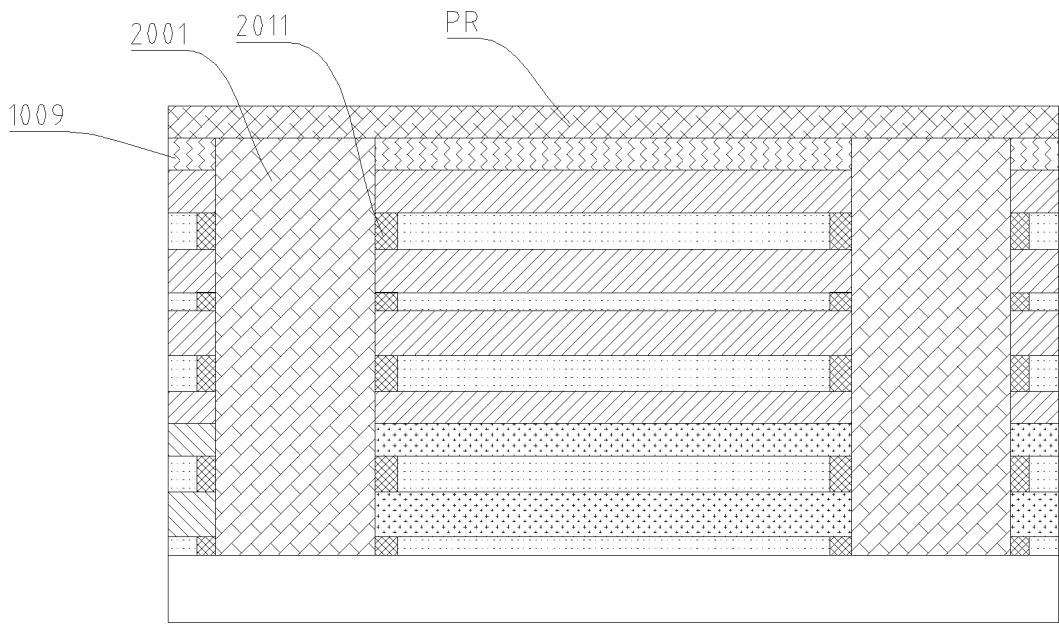
Figure 6C:
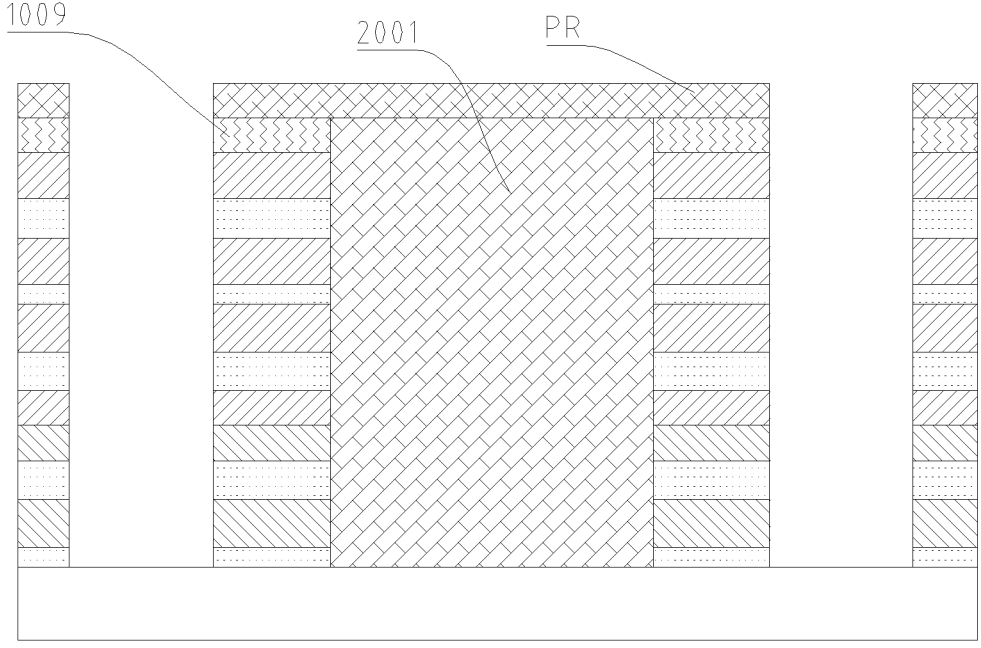
FIG. 6(c) shows a sectional view along line AA' formed according to FIG. 6 (a).

FIG. 6(*a*) schematically shows a top view of a photoresist patterning region. FIG. 6(*b*) shows a sectional view along line 11' formed according to FIG. 6 (*a*). FIG. 6(*c*) shows a sectional view along line AA' formed according to FIG. 6(*a*).

Then, as shown in FIG. 6(*a*), the first SiC layer 2001 is deposited on the exposed region of the substrate 1001 where the upper and lower lateral stripes are located, and the deposition of the first SiC layer 2001 is controlled by CMP to stop on the upper surface of the hard mask layer 1009. Then, the formed first SiC layer 2001 is etched downward at a longitudinal narrow stripe in FIG. 6 (*a*), and the etching stops on the upper surface of the substrate 1001. An end point detection method may be used to determine the etching stop time.

Thus, as shown in FIG. 6(*b*), on the section along line 11' and before etching, the first SiC layer 2001 with a height up to the hard mask layer 1009 is deposited on the substrate 1001 where the two lateral stripes are located, and the upper surfaces of the hard mask layer 1009 and the first SiC layer 2001 are coated with the photoresist.

As shown in FIG. 6(*c*), on the section along line AA', the first SiC layer 2001 with a height up to the hard mask layer 1009 is deposited between the left stack and the right stack, and outer sides of the left stack and the right stack where the first SiC layer 2001 was previously formed are etched away to form a groove down to the substrate 1001.

Figure 7:
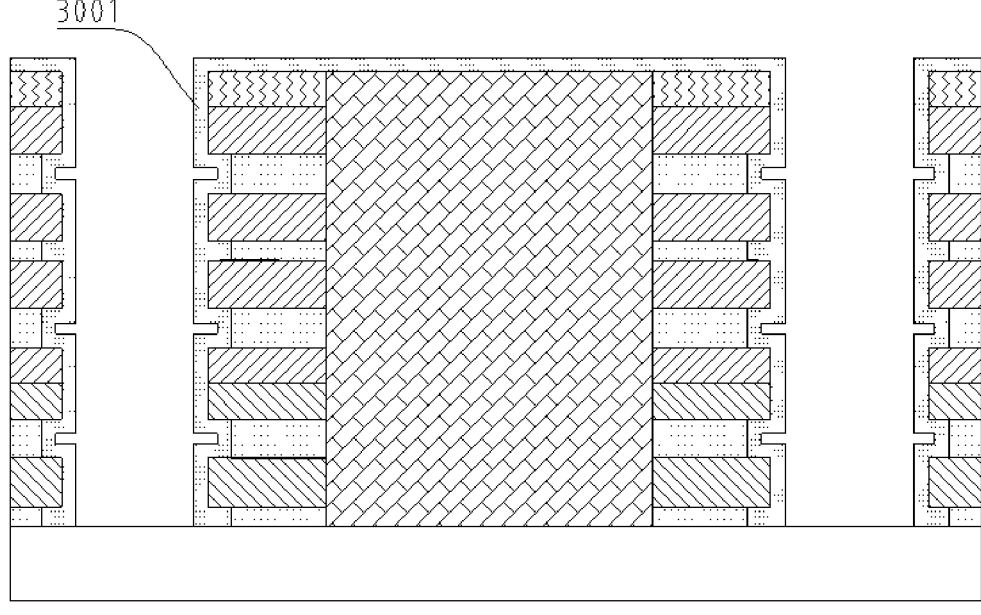

FIG. 7 schematically shows a sectional view along line AA'.

Next, as shown in FIG. 7, the photoresist is removed, and then the lower isolation layer 10021, the upper isolation layer 10022, and the channel defining layer 10051/10052/10053 are partially etched on the section along line AA', so that lateral SiGe grooves are formed in the lower isolation layer 10021, the upper isolation layer 10022, and the channel defining layer 10051/10052/10053.

The first epitaxial layer 3001 is epitaxially generated on the lateral SiGe grooves formed after etching and the outer surface extending to the entire device except the substrate 1001. The first epitaxial layer 3001 may be SiGe, and a composition of Ge is about 10% to 40%.

It should be noted that since the thickness of the lower isolation layer 10021 and the upper isolation layer 10022 is relatively small, the epitaxial thickness of the first epitaxial layer 3001 should be controlled to be greater than half of the maximum thickness of the lower isolation layer 10021 and the upper isolation layer 10022 and less than half of the maximum thickness of the channel defining layer 10051/10052/10053. Thus, after the epitaxial process, the lateral SiGe grooves may be maintained to be still formed inside the channel defining layer 10051/10052/10053, while the groove spaces of the lower isolation layer 10021 and the upper isolation layer 10022 are substantially filled by the first epitaxial layer 3001.

Figure 8:
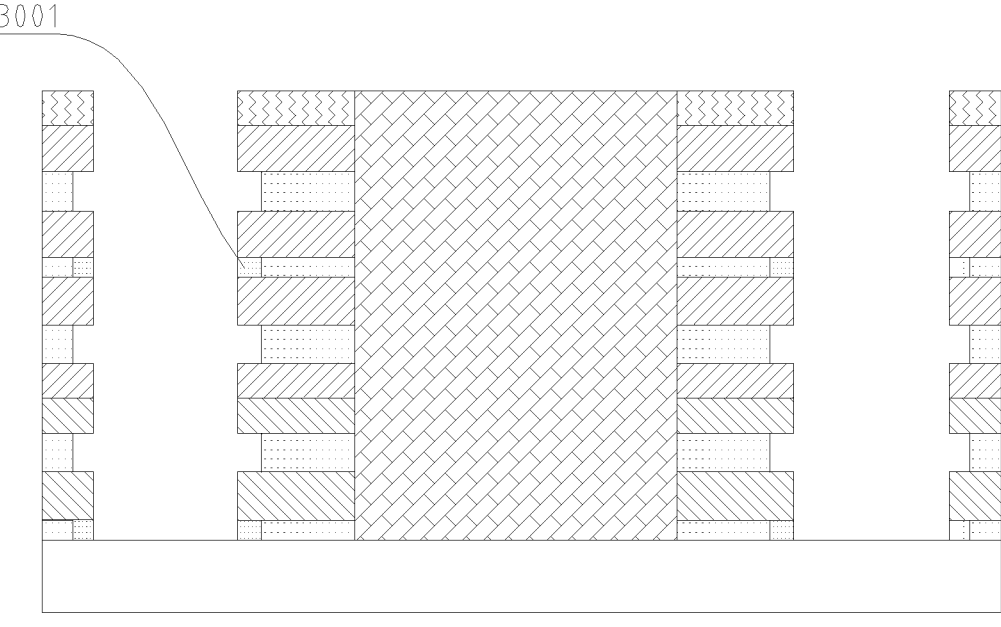

FIG. 8 schematically shows a sectional view along line AA'.

Next, as shown in FIG. 8, the first epitaxial layer 3001 is isotropically etched. Since the groove spaces of the lower isolation layer 10021 and the upper isolation layer 10022 are substantially filled by the first epitaxial layer 3001, the first epitaxial layer 3001 filled in the groove spaces may be retained in the isotropic etching process, and the first epitaxial layer 3001 of other parts in FIG. 7 is etched away.

Figure 9:
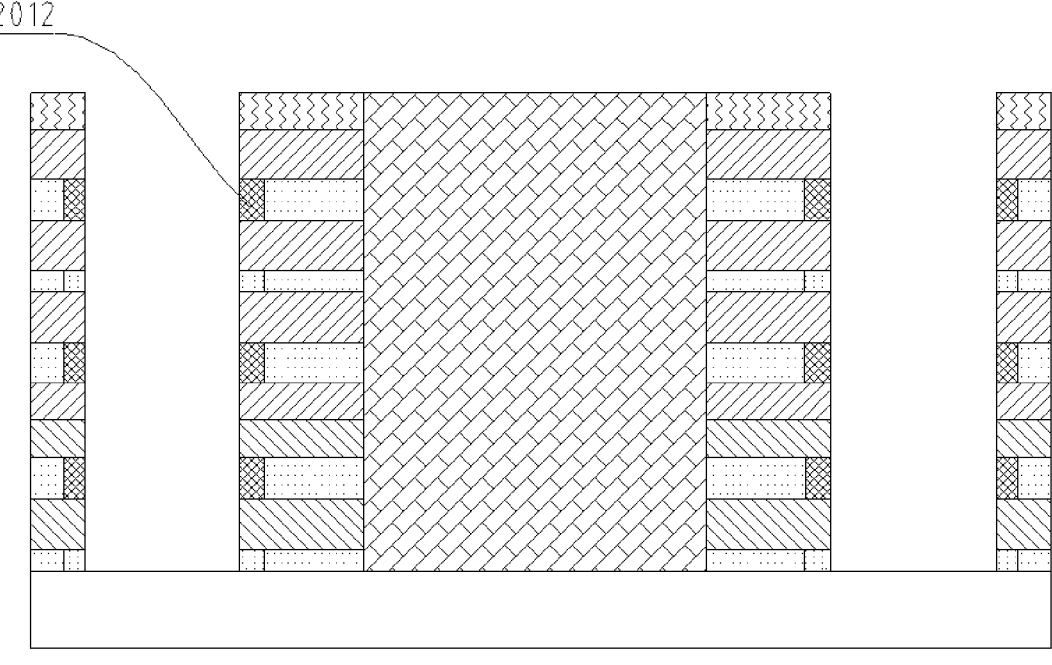

FIG. 9 schematically shows a sectional view along line AA'.

Next, as shown in FIG. 9, the second $SiO_2$ layer 2012 is deposited in the lateral SiGe groove of the channel defining layer 10051/10052/10053 in FIG. 8, and then an outer sidewall of the second $SiO_2$ layer 2012 is anisotropically etched, so that the second $SiO_2$ layer 2012 fills and occupies the lateral SiGe groove, and the outer sidewall of the second $SiO_2$ layer 2012 and the outer sidewall of the stack are kept in alignment with each other. A material of the second $SiO_2$ layer 2012 is $SiO_2$.

Therefore, the etched part of the channel defining layer 10051/10052/10053 is filled by the second $SiO_2$ layer 2012.

Figure 10:
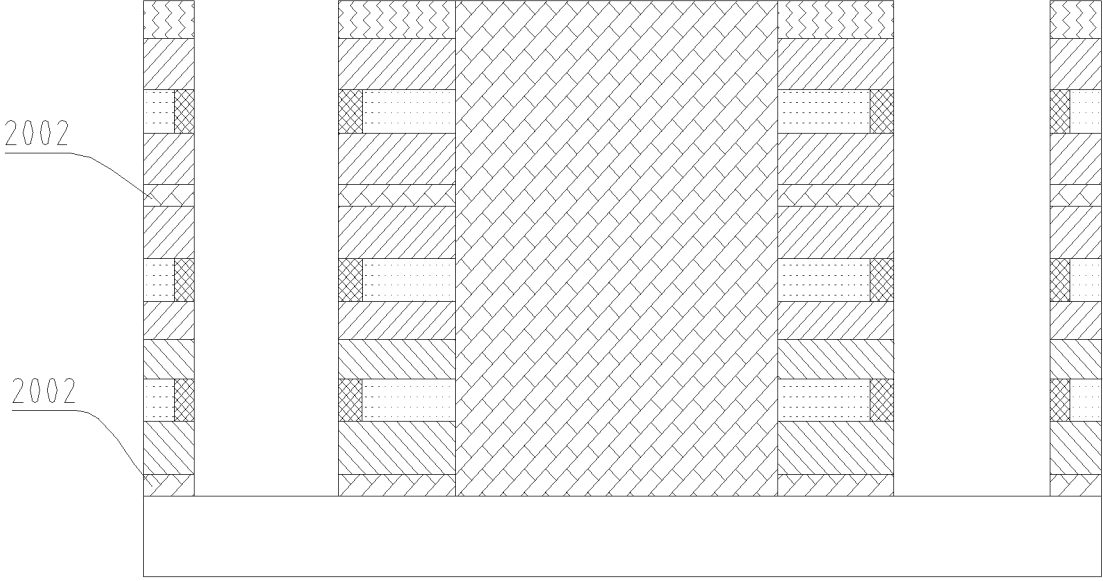

FIG. 10 schematically shows a sectional view along line AA'.

Then, as shown in FIG. 10, the lower isolation layer 10021, the upper isolation layer 10022 and the first epitaxial layer 3001 filled in the groove spaces of the lower isolation layer 10021 and the upper isolation layer 10022 are etched, the second SiC layer 2002 is deposited on the corresponding positions of the lower isolation layer 10021 and the upper isolation layer 10022, and then the second SiC layer 2002 is etched back, so that the outer sidewall of the second SiC layer 2002 and the outer sidewall of the stack are kept in alignment with each other. A material of the second SiC layer 2002 is SiC.

Therefore, the lower isolation layer 10021 and the upper isolation layer 10022 are replaced by the second SiC layer 2002. Since the first SiC layer 2001 is formed between the left stack and the right stack in the middle position of FIG. 10, the second SiC layer 2002 inside the left stack and the right stack may communicate with the first SiC layer 2001 belonging to the same material, thus the second SiC layer 2002 not only forms an interlayer isolation of different stacks, but also forms an interlayer isolation of different material layers inside the same stack.

Figure 11:
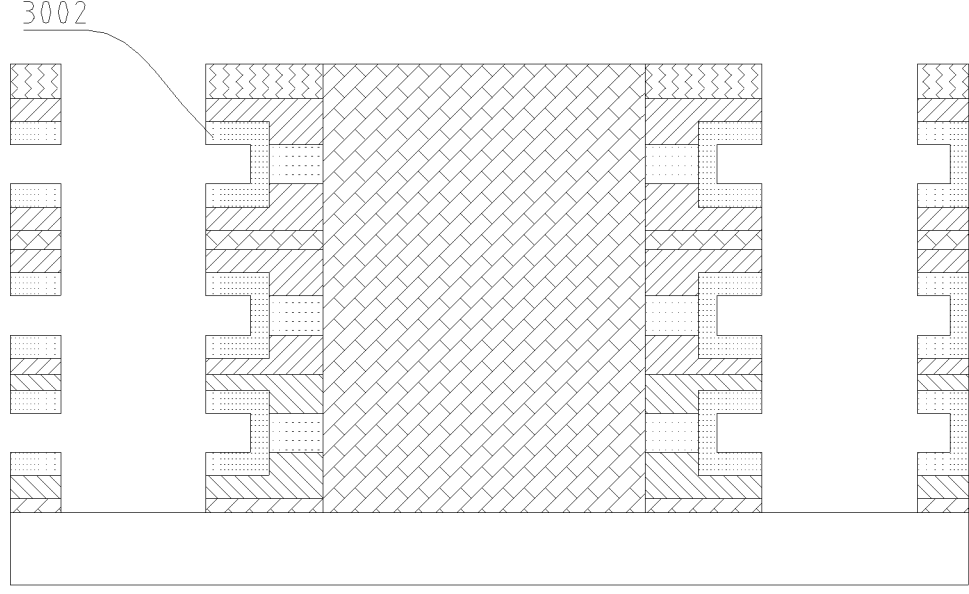

FIG. 11 schematically shows a sectional view along line AA'.

Then, as shown in FIG. 11, the second $SiO_2$ layer 2012 is etched. The first source/drain layer 10031/10032/10033, the channel defining layer 10051/10052/10053, and the second source/drain layer 10071/10072/10073 are etched at a same preset thickness in the vicinity of the second $SiO_2$ layer 2012. A second epitaxial layer 3002 is epitaxially grown in the etched-away locations. The second epitaxial layer 3002 is then anisotropically etched so that a C-shaped channel is formed between the second epitaxial layer 3002 of the adjacent first source/drain layer, channel defining layer and second source/drain layer of the same MOS layer. A material of the second epitaxial layer 3002 may be Si. For the convenience of description, the C-shaped channel is marked as a channel layer 200.

Figure 12:
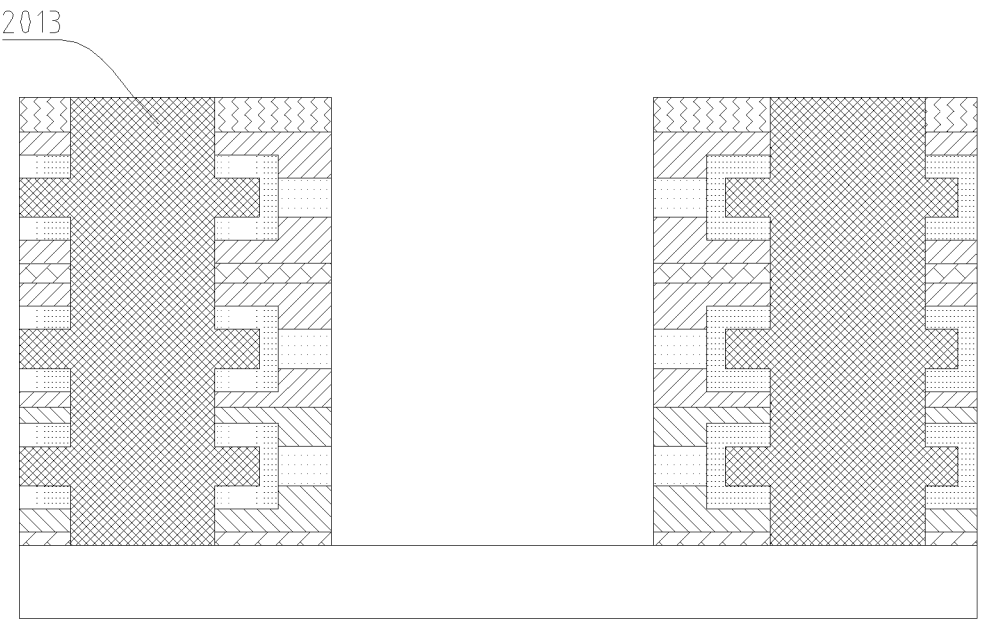

FIG. 12 schematically shows a sectional view along line AA'.

Then, as shown in FIG. 12, the third $SiO_2$ layer 2013 is deposited in the outer grooves of the left stack and the right stack in the middle position, and the deposition of the third $SiO_2$ layer 2013 is controlled by CMP to stop on the upper surface of the hard mask layer 1009. Then, the first SiC layer 2001 between the left stack and the right stack is etched downward, and the etching stops on the upper surface of the substrate 1001.

A material of the third $SiO_2$ layer 2013 is $SiO_2$, and the etching stop time may be determined by the end point detection method.

Figure 13:
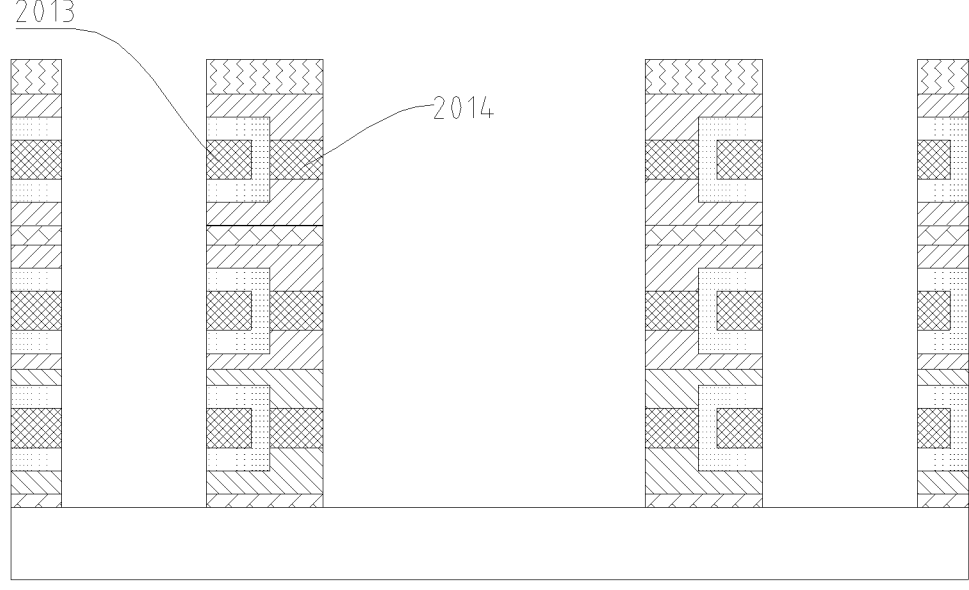

FIG. 13 schematically shows a sectional view along line AA'.

Then, as shown in FIG. 13, the channel defining layer 10051/10052/10053 is selectively etched, the fourth $SiO_2$ layer 2014 is deposited on the corresponding position of the channel defining layer 10051/10052/10053, and the deposition of the third $SiO_2$ layer 2013 is controlled by CMP to stop on the upper surface of the hard mask layer 1009. Then, the fourth $SiO_2$ layer 2014 between the left stack and the right stack and the third $SiO_2$ layer 2013 formed on the outside of the left stack and the right stack are etched downward, so that the outer sidewalls of the fourth $SiO_2$ layer 2014 and the third $SiO_2$ layer 2013 are aligned with the outer sidewall of the stack.

Thus, the channel defining layer 10051/10052/10053 previously in different MOS layers is replaced by the third $SiO_2$ layer 2013, the fourth $SiO_2$ layer 2014 and the channel layer 200 arranged between the third $SiO_2$ layer 2013 and the fourth $SiO_2$ layer 2014.

Figure 14:
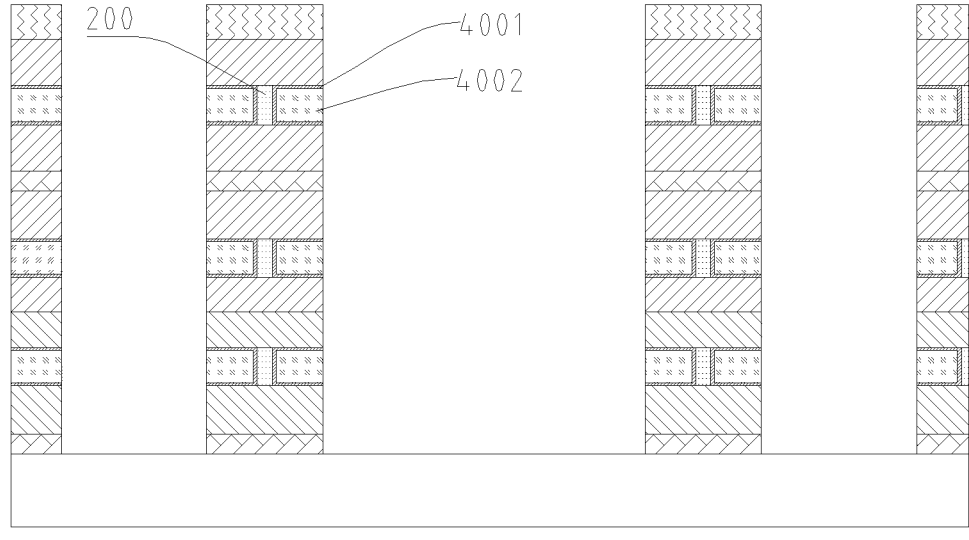

FIG. 14 schematically shows a sectional view along line AA'.

Then, as shown in FIG. 14, the fourth $SiO_2$ layer 2014 and the third $SiO_2$ layer 2013 are etched, and a gate dielectric layer 4001 and a p-type gate conductor layer 4002 are sequentially deposited at the corresponding positions of the fourth $SiO_2$ layer 2014 and the third $SiO_2$ layer 2013 to form a p-type gate stack. Thus, the gate dielectric layer 4001 is filled into recesses of the fourth $SiO_2$ layer 2014 and the third $SiO_2$ layer 2013, and the p-type gate conductor layer 4002 fills an inner wall of the gate dielectric layer 4001. In order to control an etching depth, the formed p-type gate conductor layer 4002 needs to be etched back finally.

The gate dielectric layer 4001 may be made of a dielectric material with high dielectric constant, such as HfO2, with a thickness of about 1 nm to 5 nm. The p-type gate conductor layer 4002 may be deposited on the surface of the gate dielectric layer 4001 in a substantially conformal manner, so as to fill an inner wall of the gate dielectric layer 4001. The p-type gate conductive layer 4002 may include a p-type work function regulating metal and a p-type gate conductive metal.

The p-type gate stack thus formed (including the gate dielectric layer 4001 and the p-gate conductor layer 4002) is respectively formed on the lateral outer peripheries of the channel layer 200 where the PMOS layer, the first NMOS layer and the second NMOS layer are located. The p-type gate stack may be embedded between the first source/drain layer 10031/10032/10033 and the second source/drain layer 10071/10072/10073, and surround the lateral outer periphery of the channel layer 200.

Figure 15:
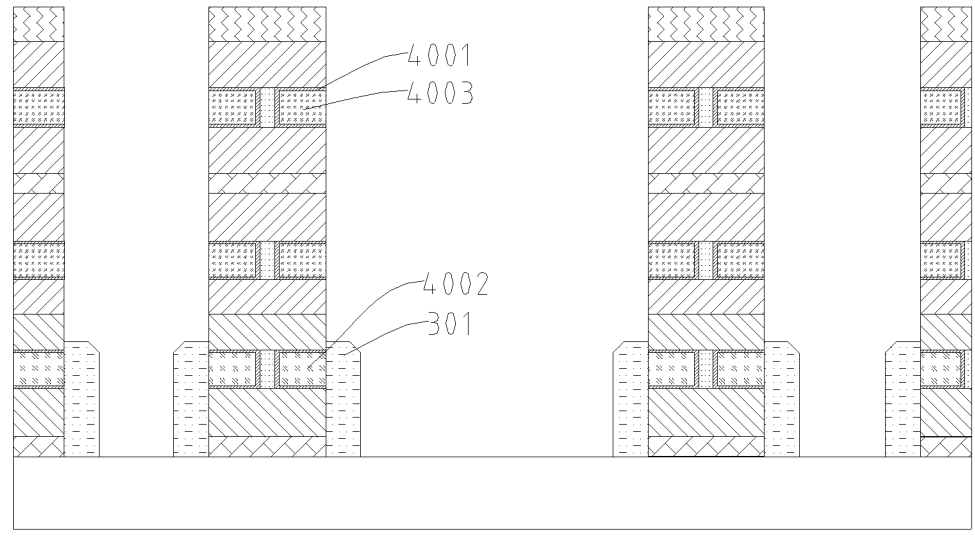

FIG. 15 schematically shows a sectional view along line AA'.

Then, as shown in FIG. 15, $SiO_2$ is deposited at the bottom of each stack, and then the $SiO_2$ is etched and the etching stops at the first preset height to form a first spacing portion 301. Specifically, the first preset height is higher than a bottom of the second source/drain layer 10071 of the PMOS layer and lower than a top of the first source/drain layer 10032 of the first NMOS layer. Thus, the first spacing portion 301 may isolate the p-type gate conductor layer 4002 in the PMOS layer to avoid subsequent effects.

Then, the p-type gate conductor layer 4002 at the corresponding positions of the first NMOS layer and the second NMOS layer is etched, and the n-type gate conductor layer 4003 is deposited at the corresponding position of the p-type gate conductor layer 4002 to form an n-type gate stack. In order to control the etching depth, the formed n-type gate conductor layer 4003 needs to be etched back finally.

Therefore, on the first NMOS layer and the second NMOS layer, the n-type gate conductor layer 4003 may be deposited on the surface of the gate dielectric layer 4001 in a substantially conformal manner, so as to fill the inner wall of the gate dielectric layer 4001. The n-type gate conductive layer 4003 may include an n-type work function regulating metal and an n-type gate conductive metal.

The n-type gate stack thus formed (including the gate dielectric layer 4001 and the n-type gate conductor layer 4003) is respectively formed on the lateral outer periphery of the channel layer 200 where the first NMOS layer and the second NMOS layer are located. The n-type gate stack may be embedded between the first source/drain layer 10032/10033 and the second source/drain layer 10072/10073, and surround the lateral outer periphery of the channel layer 200.

Figure 16:
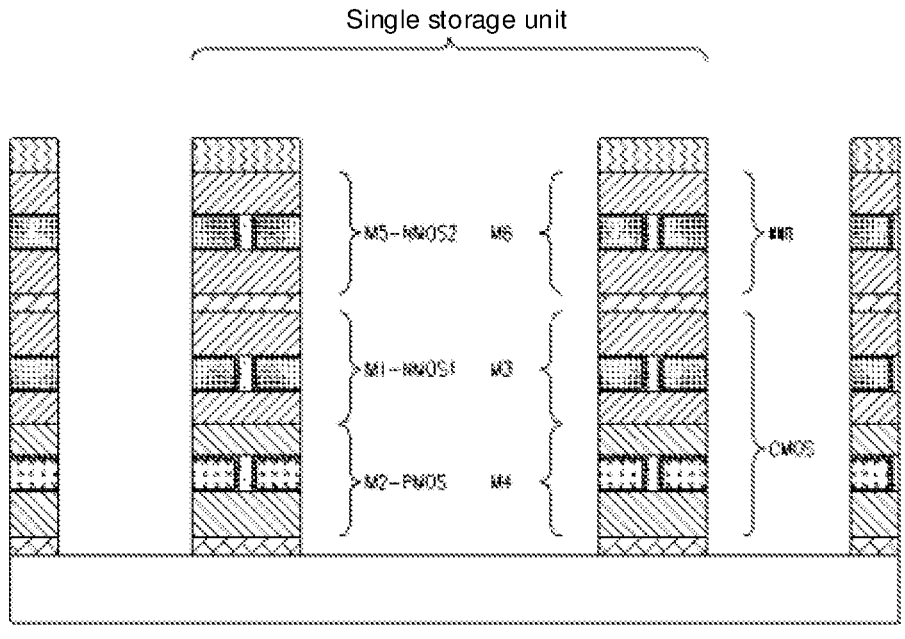

FIG. 16 schematically shows a sectional view along line AA'.

Next, as shown in FIG. 16, the first spacing portion 301 is etched to form a structure of the minimum SRAM memory unit.

Specifically, the SRAM memory unit may include: a substrate; a memory unit array on the substrate, wherein the memory unit array includes a plurality of memory units, wherein each memory unit includes: a left stack and a right stack arranged at an interval in a horizontal direction, wherein each of the left stack and the right stack includes a lower isolation layer, a PMOS layer, a first NMOS layer, an upper isolation layer and a second NMOS layer stacked on the substrate sequentially, each of the PMOS layer, the first NMOS layer and the second NMOS layer includes a first source/drain layer, a channel layer and a second source/drain layer vertically stacked, and the channel layer is laterally recessed with respect to the first source/drain layer and the second source/drain layer; and a gate stack between the first source/drain layer and the second source/drain layer in a vertical direction, and disposed on opposite sides of the channel layer to be embedded into a lateral recess of the channel layer. At the same time, the SRAM memory unit further includes a hard mask layer disposed on the first source/drain layer of the second NMOS layer.

Figure 17A:
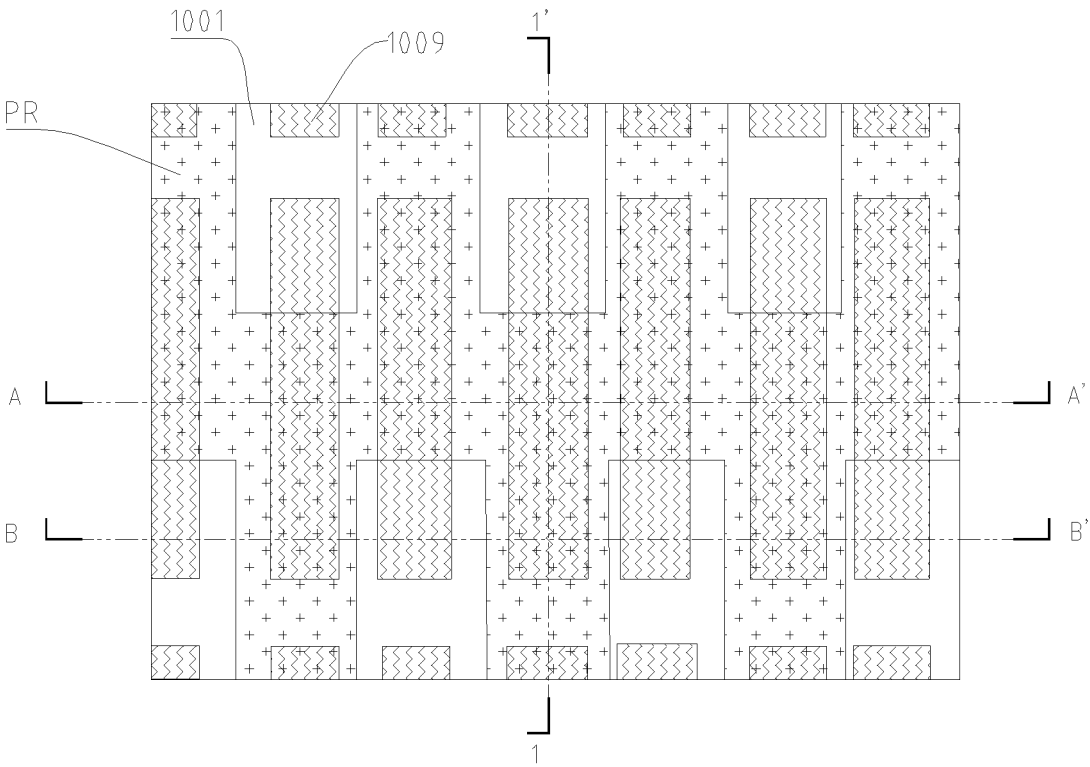
FIG. 17(a) schematically shows a top view of a photoresist patterning region.
Figure 17B:
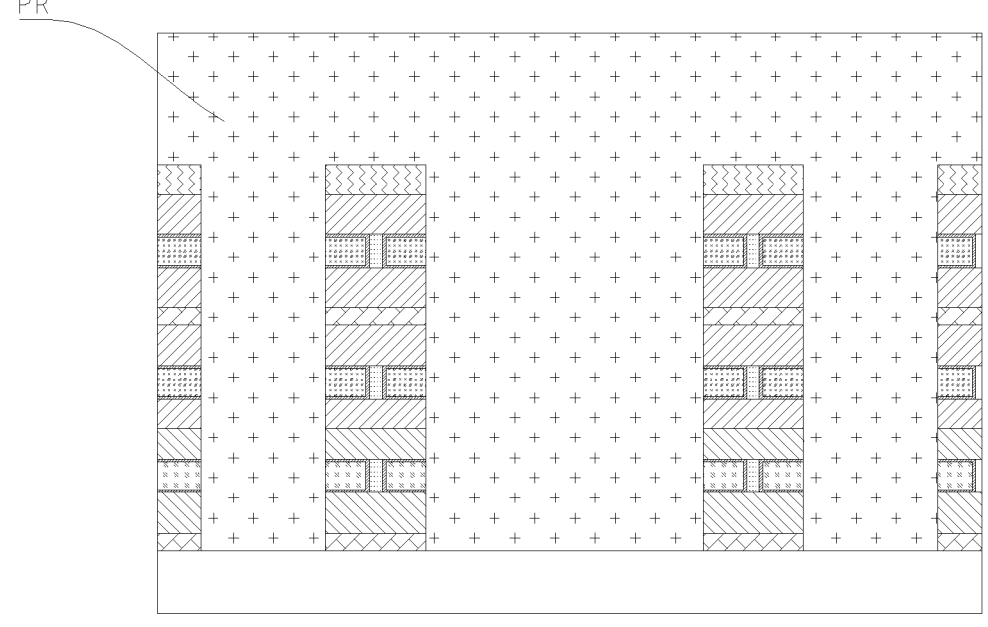
FIG. 17(b) shows a sectional view along line AA' formed according to FIG. 17(a).
Figure 17C:
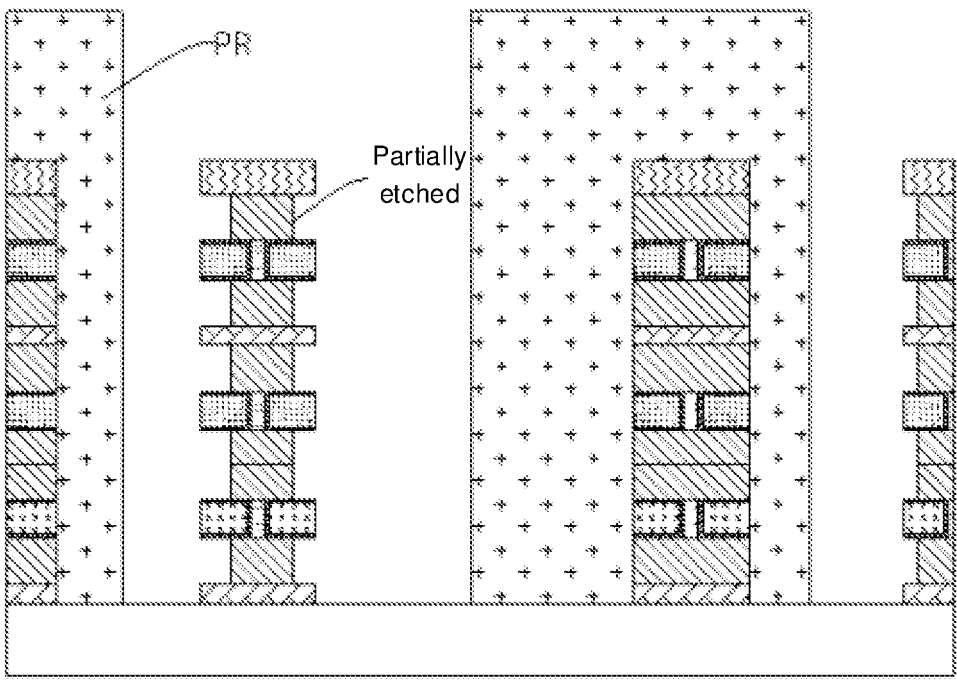
FIG. 17(c) shows a sectional view along line BB' formed according to FIG. 17(a).
Figure 18A:
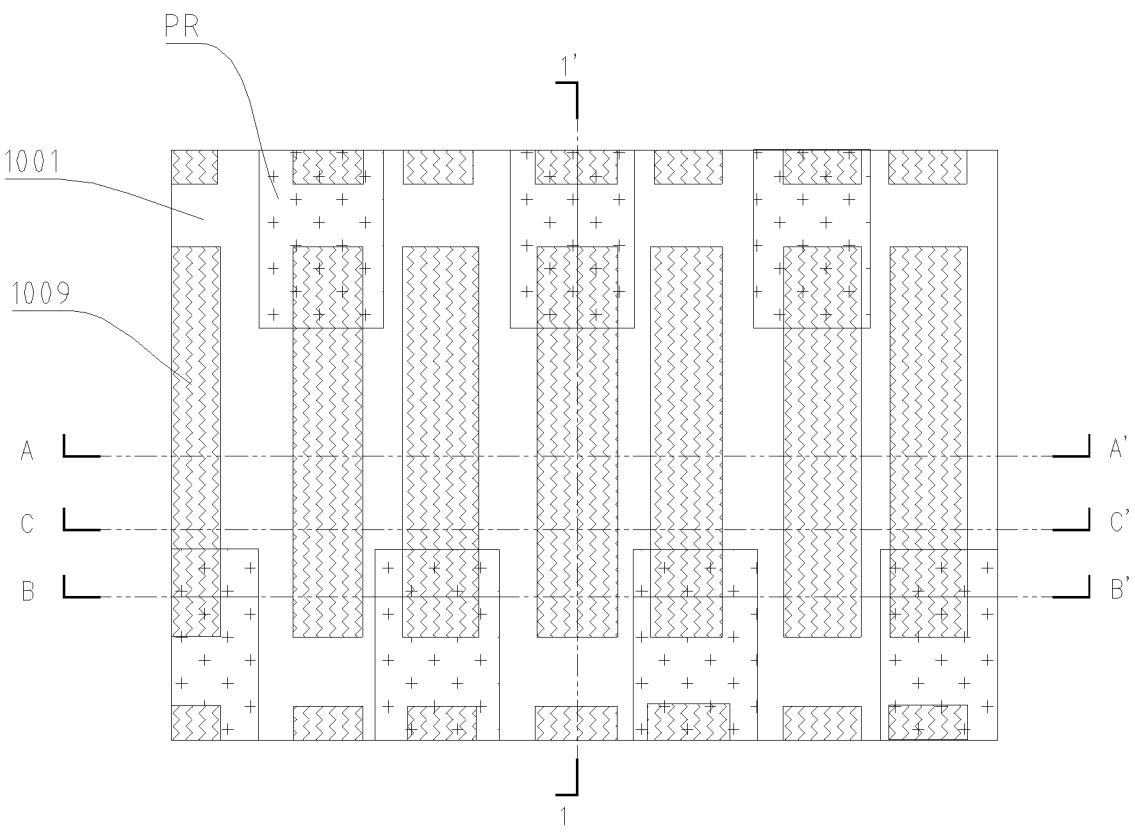
FIG. 18(a) schematically shows a top view of a photoresist patterning region.
Figure 18B:
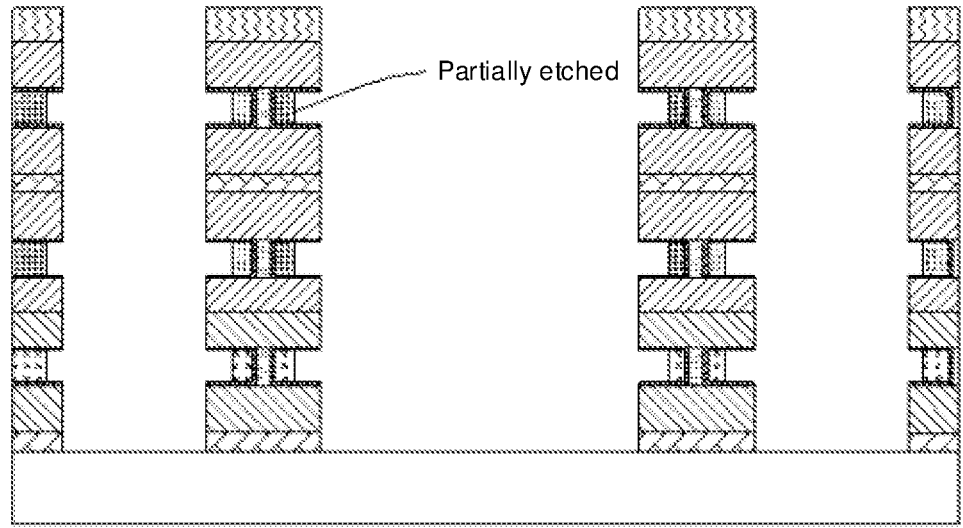
FIG. 18(b) shows a sectional view along line AA' formed according to FIG. 18(a).
Figure 18C:
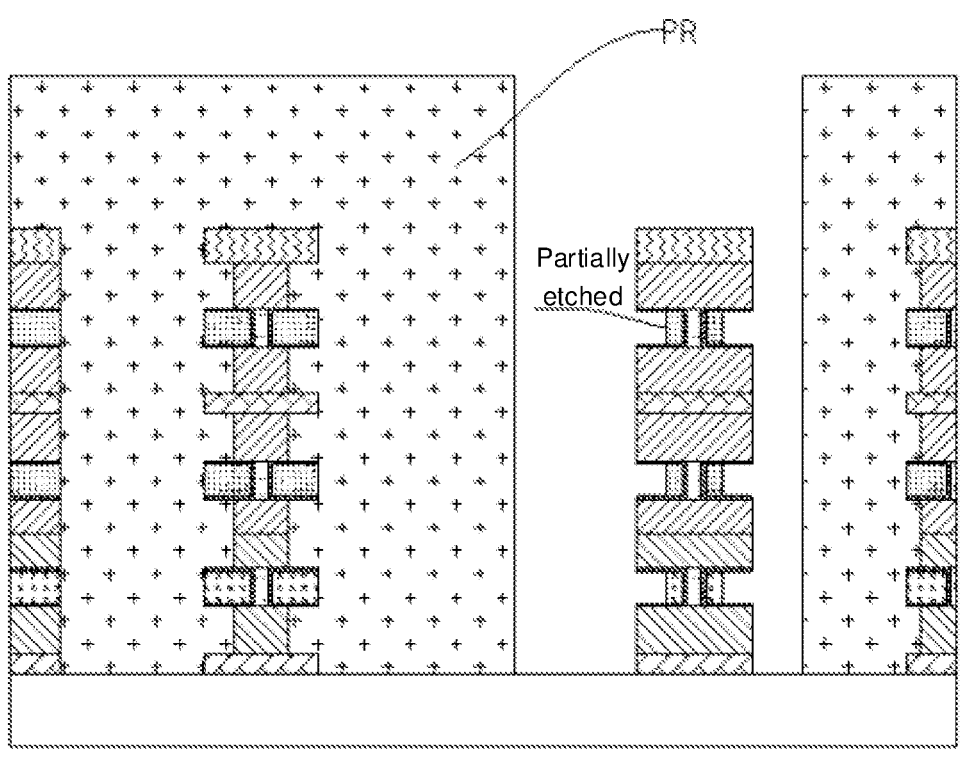
FIG. 18(c) shows a sectional view along line BB' formed according to FIG. 18(a).
Figure 18D:
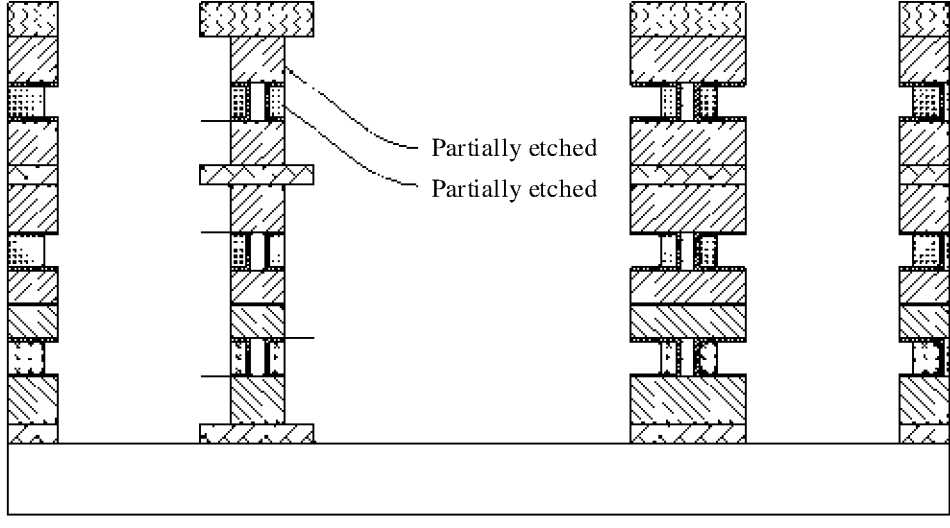
FIG. 18(d) shows a sectional view along line CC' formed according to FIG. 18(a).
Figure 19A:
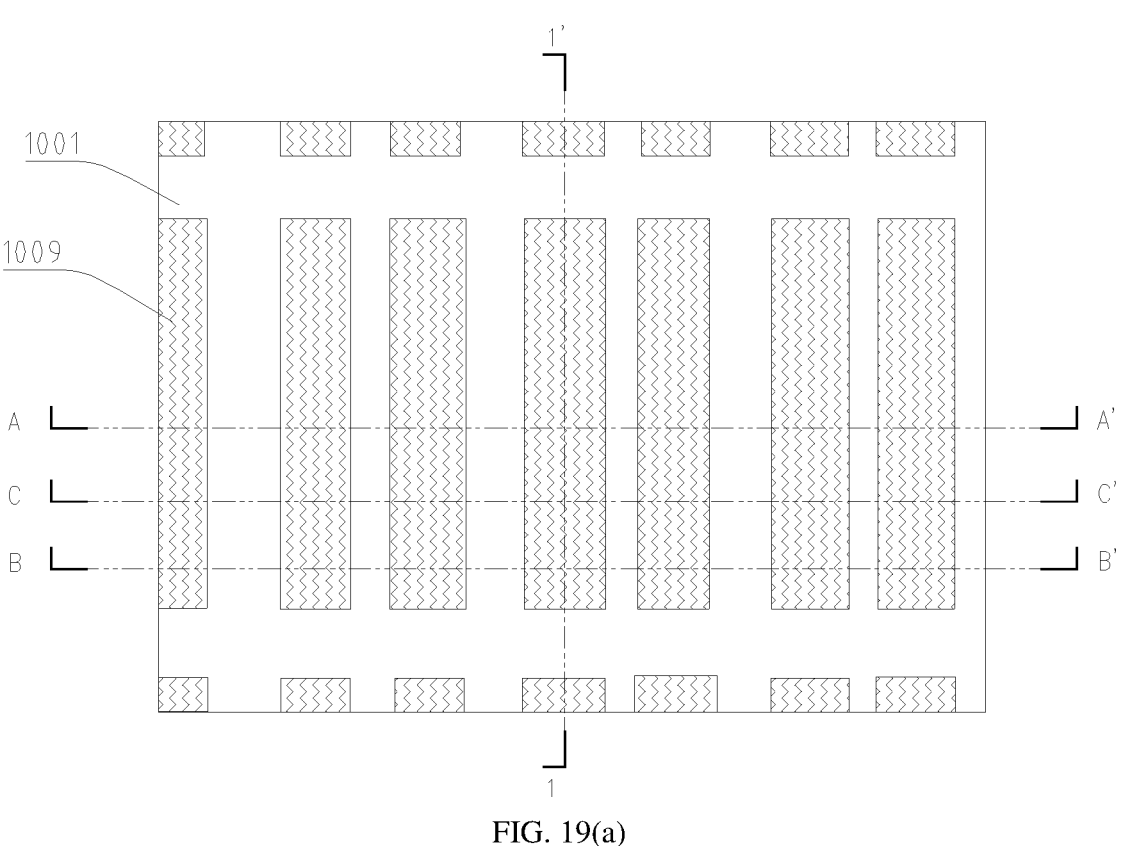
FIG. 19(a) schematically shows a top view of a photoresist patterning region.
Figure 19B:
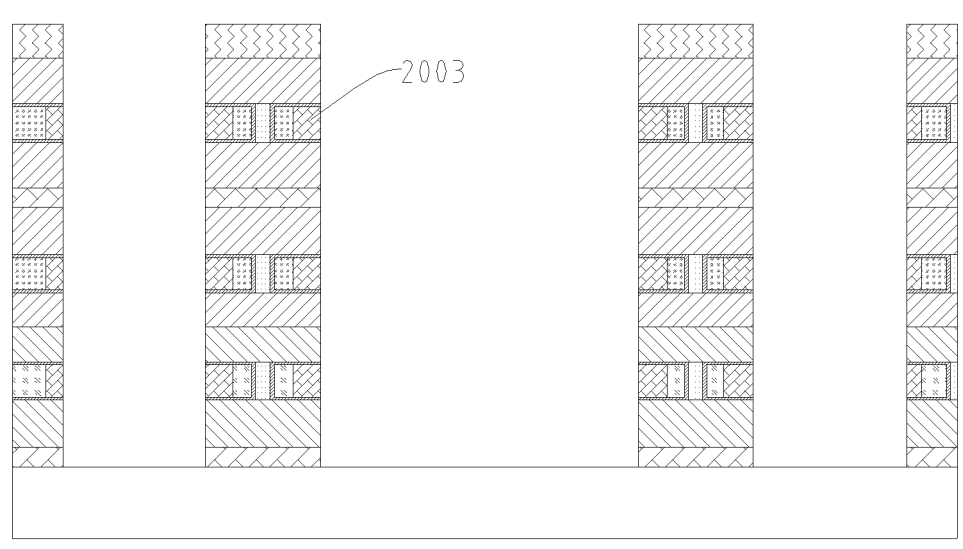
FIG. 19(b) shows a sectional view along line AA' formed according to FIG. 19(a).
Figure 19C:
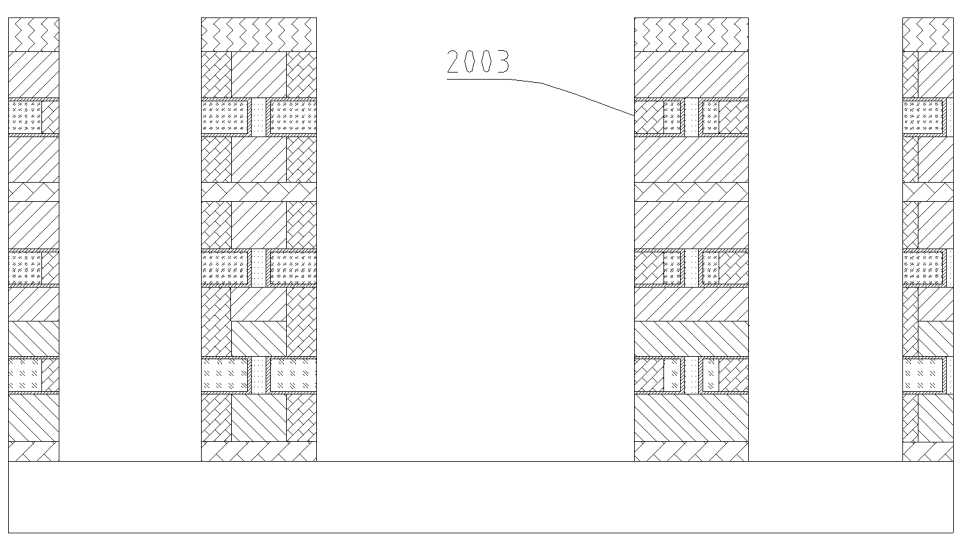
FIG. 19(c) shows a sectional view along line BB' formed according to FIG. 19(a).
Figure 19D:
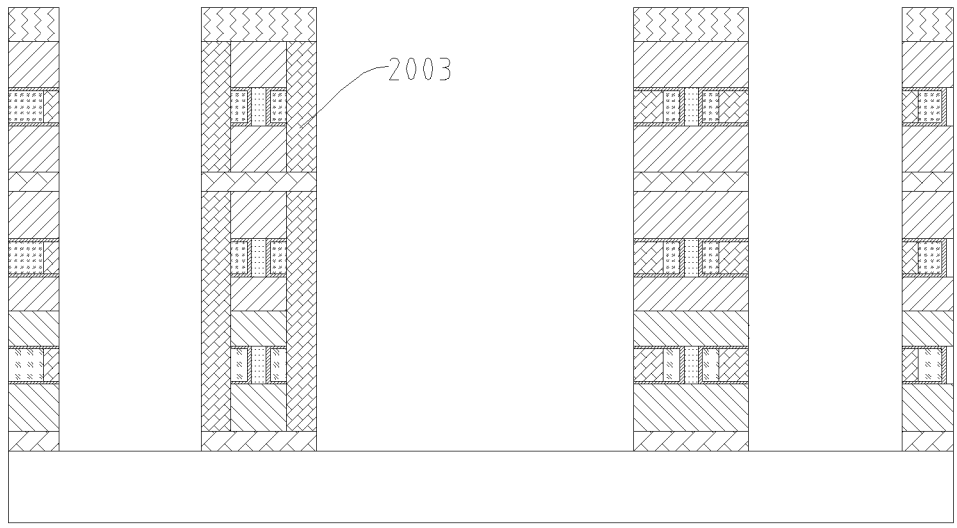
FIG. 19(d) shows a sectional view along line CC' formed according to FIG. 19(a).

FIG. 17 (*a*) schematically shows a top view of a photoresist patterning region. FIG. 17 (*b*) shows a sectional view along line AA' formed according to FIG. 17 (*a*). FIG. 17 (*c*) shows a sectional view along line BB' formed according to FIG. 17 (*a*).

Then, as shown in FIG. 17 (*a*), the photoresist is spin-coated on the region where PR is located. The first source/drain layer 10031/10032/10033 and the second source/drain layer 10071/10072/10073 are partially etched in the horizontal direction on the region where PR is not spin-coated. Preferably, the etching depth of the first source/drain layer 10031/10032/10033 and the second source/drain layer 10071/10072/10073 may be half of the p-type gate conductor layer 4002 or the n-type gate conductor layer 4003 in the horizontal direction.

Therefore, as shown in FIG. 17(*b*), the section along line AA' is coated with the photoresist PR, and thus is not etched. As shown in FIG. 17(*c*), the middle left stack on the section along line BB' is not spin-coated with the photoresist, thus the first source/drain layer 10031/10032/10033 and the second source/drain layer 10071/10072/10073 of this part are partially etched, and the etching depth is approximately half of the horizontal direction of the p-type gate conductor layer 4002 or the n-type gate conductor layer 4003.

FIG. 18(*a*) schematically shows a top view of a photoresist patterning region. FIG. 18(*b*) shows a sectional view along line AA' formed according to FIG. 18(*a*). FIG. 18(*c*) shows a sectional view along line BB' formed according to FIG. 18(*a*). FIG. 18(*d*) shows a sectional view along line CC' formed according to FIG. 18(*a*).

Then, as shown in FIG. 18 (*a*), the photoresist is spin-coated on the region where PR is located, and the p-type gate conductor layer 4002 and the n-type gate conductor layer 4003 are partially etched in the horizontal direction on the region where the photoresist is not spin-coated. Preferably, the etching depth of the p-type gate conductor layer 4002 and the n-type gate conductor layer 4003 may be half of the p-type gate conductor layer 4002 or the n-type gate conductor layer 4003 in the horizontal direction.

It should be noted that the region where PR is located in FIG. 18(*a*) is complementary to the region where PR is located in FIG. 17(*a*) in the best case, that is, the two regions do not intersect with each other and together form the external contour of the device in the whole top view.

Therefore, as shown in FIG. 18(*b*), the section along line AA' is not spin-coated with the photoresist, thus the p-type gate conductor layer 4002 and the n-type gate conductor layer 4003 of the section are partially etched, and the etching depth is approximately half of the p-type gate conductor layer 4002 or the n-type gate conductor layer 4003 in the horizontal direction.

As shown in FIG. 18(*c*), the middle left stack on the section along line BB' is coated with the photoresist and the right stack is not coated with the photoresist, thus the p-type gate conductor layer 4002 and the n-type gate conductor layer 4003 on the right stack in FIG. 18(*c*) are partially etched. In addition, since the middle left stack on the section is not covered by the photoresist in FIG. 17(*a*), the first source/drain layer 10031/10032/10033 and the second source/drain layer 10071/10072/10073 on the left stack in FIG. 17(*a*) are partially etched.

As shown in FIG. 18(*d*), the section along line CC' is not coated with the photoresist, thus the p-type gate conductor layer 4002 and n-type gate conductor layer 4003 on all stack structures are partially etched. It should also be noted that since the middle left stack of the section along line CC' is also exposed in FIG. 17 (*a*), i.e., not covered by the photoresist, the first source/drain layer 10031/10032/10033 and the second source/drain layer 10071/10072/10073 of the middle left stack on the section are also partially etched. Therefore, the first source/drain layer 10031/10032/10033 and the second source/drain layer 10071/10072/10073 of the middle left stack in FIG. 18 (*d*), the p-type gate conductor layer 4002, and the n-type gate conductor layer 4003 are partially etched. Since a gap of a photolithography process may not be avoided, several gate metal nanowires protruding from the gate metal and the source/drain layer may be seen.

FIG. 19(*a*) schematically shows a top view of a photoresist patterning region. FIG. 19(*b*) shows a sectional view along line AA' formed according to FIG. 19(*a*). FIG. 19(*c*) shows a sectional view along line BB' formed according to FIG. 19(*a*). FIG. 19(*d*) shows a sectional view along line CC' formed according to FIG. 19(*a*).

Then, as shown in FIG. 19 (*a*), a third SiC layer 2003 is deposited on the exposed region of the substrate 1001, and the deposition of the third SiC layer 2003 is controlled by CMP to stop on the upper surface of the hard mask layer 1009. Then, the formed third SiC layer 2003 is etched downward, and the etching stops on the upper surface of the substrate 1001. The third SiC layer 2003 may be SiC material, and the etching stop time may be determined by the end point detection method.

Thus, the recesses of each stack exposed by previous partial etching are filled with the third SiC layer 2003 to isolate the p-type gate conductor layer 4002 and the n-type gate conductor layer 4003 at different heights of the same stack. In addition, the corresponding outer sidewalls of each layer in the stack may be coplanar in the vertical direction.

Therefore, as shown in FIG. 19 (*b*), on the section along line AA', the recesses of the p-type gate conductor layer 4002 and the n-type gate conductor layer 4003 at different MOS layers in FIG. 18 (*b*) are filled with the third SiC layer 2003.

As shown in FIG. 19 (*c*), on the section along line BB', the recesses of the first source/drain layer 10031/10032/10033, the second source/drain layer 10071/10072/10073, the p-type gate conductor layer 4002, and the n-type gate conductor layer 4003 at different MOS layers in FIG. 18 (*c*) are all filled with the third SiC layer 2003. Similarly, as shown in FIG. 19 (*d*), on the section along line CC', the recesses of the first source/drain layer 10031/10032/10033, the second source/drain layer 10071/10072/10073, the p-type gate conductor layer 4002, and the n-type gate conductor layer 4003 at different MOS layers in FIG. 18 (*d*) are all filled with the third SiC layer 2003.

Figure 20:
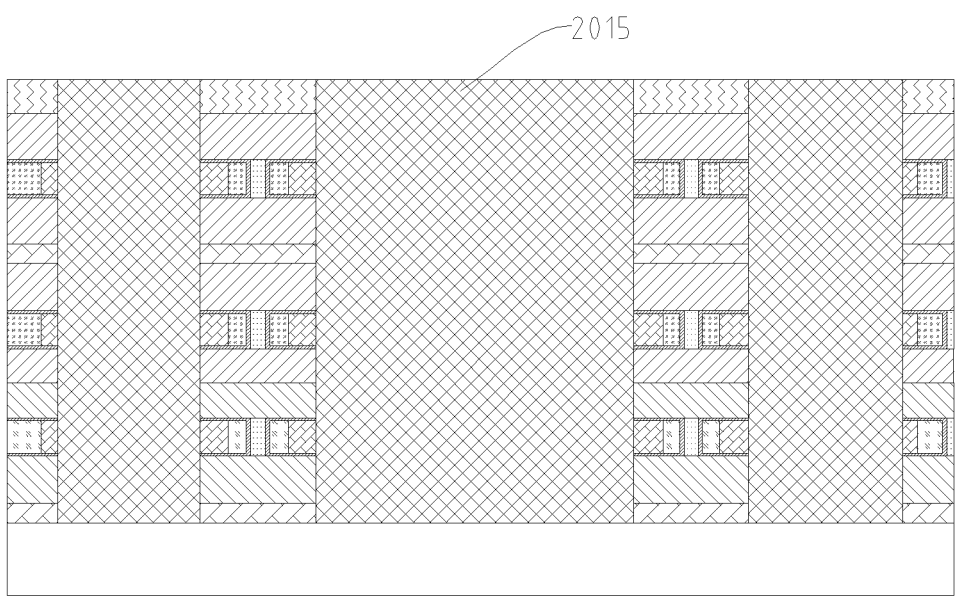

FIG. 20 schematically shows a sectional view along line AA'.

Next, as shown in FIG. 20, on the section along line AA', the fifth SiO$_2$ layer 2015 is deposited on the exposed region of the substrate 1001, and the deposition of the fifth SiO$_2$ layer 2015 is controlled by CMP to stop on the upper surface of the hard mask layer 1009. Thus, the fifth SiO$_2$ layer 2015 may form a shallow trench isolation (STI) between the left stack and the right stack.

Figure 21A:
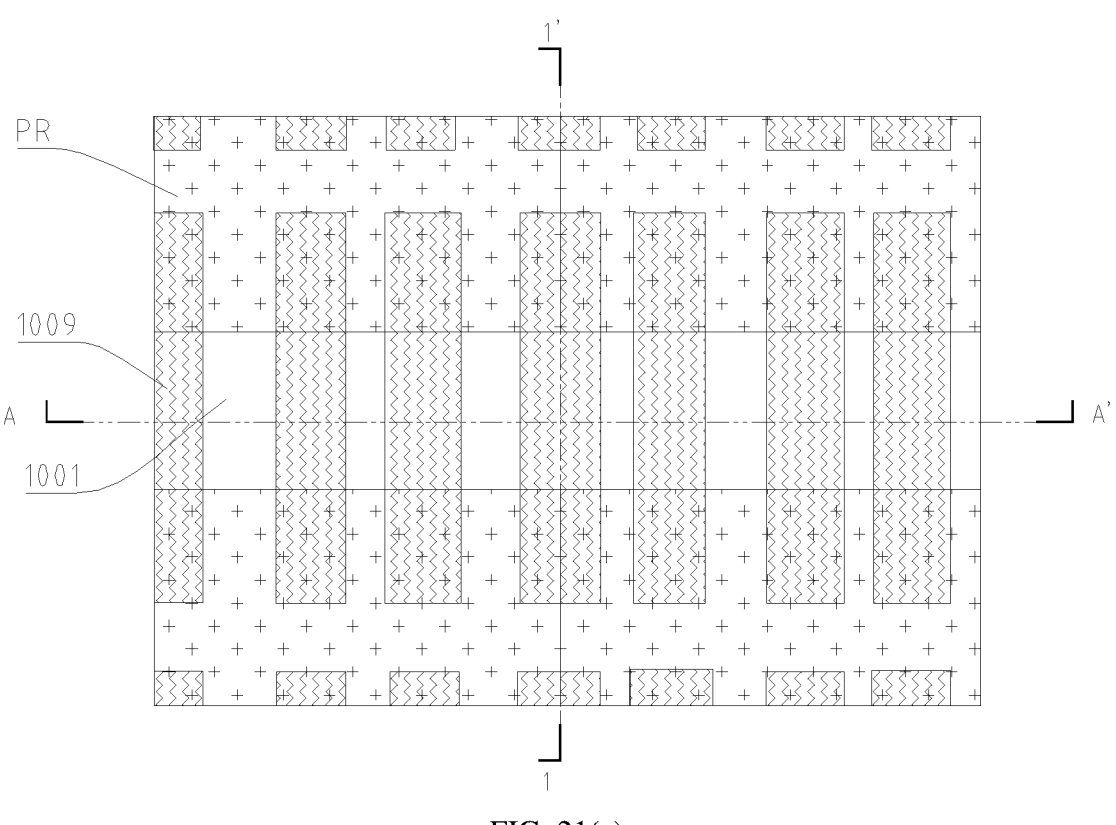
FIG. 21(a) schematically shows a top view of a photoresist patterning region.
Figure 21B:
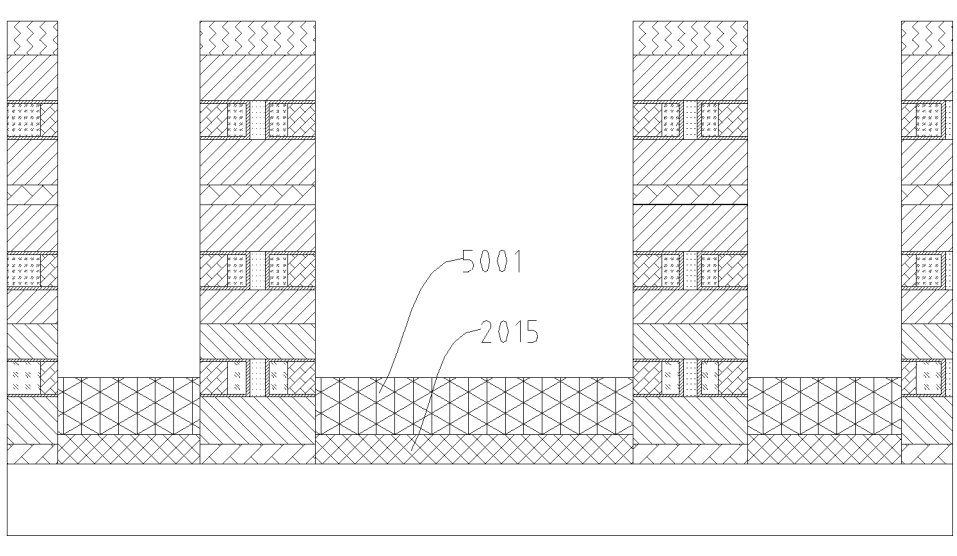
FIG. 21(b) shows a sectional view along line AA' formed according to FIG. 21(a).

FIG. 21(*a*) schematically shows a top view of a photoresist patterning region. FIG. 21(*b*) shows a sectional view along line AA' formed according to FIG. 21(*a*).

As shown in FIG. 21(*a*), horizontal wide stripes on the upper and lower sides of section AA' are not covered by the photoresist, and other parts are covered with the photoresist. The fifth SiO$_2$ layer 2015 is etched downward at the horizontal wide stripes, and the etching stops at a second preset height. The second preset height is higher than a bottom of the first source/drain layer 10031 and lower than a top of the first source/drain layer 10031.

Then, in order to reduce the series resistance and contact resistance of the active region, it is also necessary to form metal silicides on the active region, and a surface of the fifth SiO$_2$ layer 2015 is treated by a metal silicide process. Silicide may make the metal do not react with the contacted SiO$_2$ material, thus the silicide may be well aligned with the active region and a polysilicon gate.

Next, a first metal layer 5001 is deposited on the etched fifth SiO$_2$ layer 2015, and the deposition of the first metal layer 5001 is controlled by CMP to stop on the upper surface of the hard mask layer 1009. Then, the first metal layer 5001 is etched downward, and the etching stops at a third preset height.

The third preset height is higher than the top of the first source/drain layer 10031 and lower than the bottom of the second source/drain layer 10071. It may be seen from FIG. 1 that the first metal layer 5001 may be used to form a power line Vdd.

Figure 22:
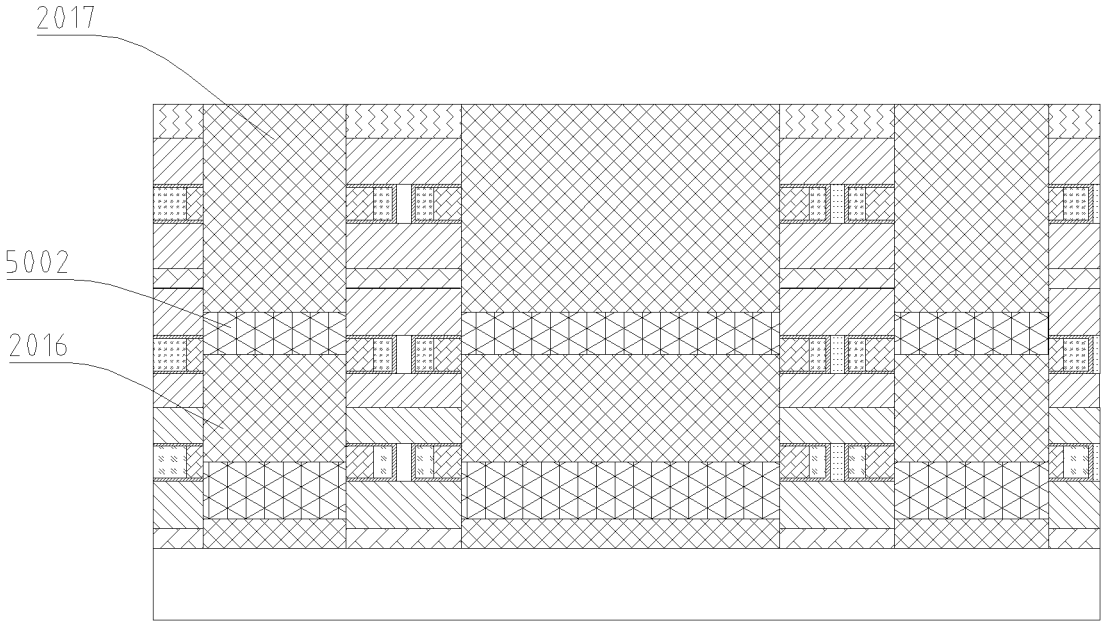

FIG. 22 schematically shows a sectional view along line AA'.

Then, as shown in FIG. 22, with reference to the process in FIG. 20, FIG. 21(*a*), and FIG. 21(*b*), the sixth SiO$_2$ layer 2016 and the second metal layer 5002 are sequentially formed on the first metal layer 5001. Different from the process in FIG. 20, FIG. 21(*a*), and FIG. 21(*b*), the etching of the sixth SiO$_2$ layer 2016 stops at a fourth preset height, and the etching of the second metal layer 5002 stop at a fifth preset height.

Specifically, the sixth SiO$_2$ layer 2016 is deposited on the first metal layer 5001, and the deposition of the sixth SiO$_2$ layer 2016 is controlled by CMP to stop on the upper surface of the hard mask layer 1009, so that the sixth SiO$_2$ layer 2016 forms a STI between the left stack and the right stack. Then, the sixth SiO$_2$ layer 2016 is etched downward, and the etching stops at the fourth preset height, thereby forming the sixth SiO$_2$ layer 2016 on the first metal layer 5001.

Then, the second metal layer 5002 is deposited on the sixth SiO$_2$ layer 2016, and the deposition of the second metal layer 5002 is controlled by CMP to stop on the upper surface of the hard mask layer 1009. Then, the second metal layer 5002 is etched downward, and the etching stops at the fourth preset height, thereby forming the second metal layer 5002 on the sixth SiO$_2$ layer 2016.

The fourth preset height is higher than the top of the first source/drain layer 10032 and lower than the bottom of the second source/drain layer 10072. Thus, the sixth SiO$_2$ layer 2016 may form a shallow trench isolation between the left stack and the right stack.

The fifth preset height is higher than the bottom of the second source/drain layer 10072 and lower than the top of the second source/drain layer 10072. It may be seen from FIG. 1 that the second metal layer 5002 may be used to form a ground wire GND.

After the second metal layer 5002 is formed, the seventh SiO$_2$ layer 2017 needs to be deposited on the second metal layer 5002, and the deposition of the seventh SiO$_2$ layer 2017 is controlled by CMP to stop on the upper surface of the hard mask layer 1009.

Figure 23A:
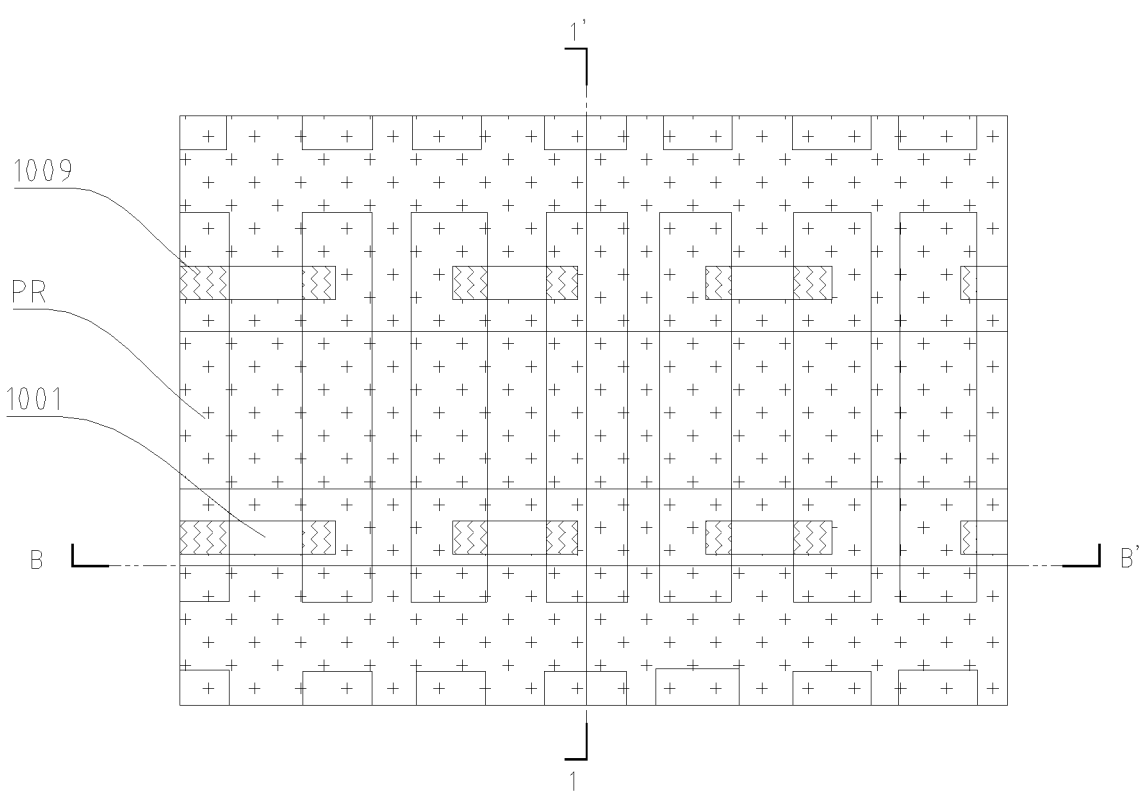
FIG. 23(a) schematically shows a top view of a photoresist patterning region.
Figure 23B:
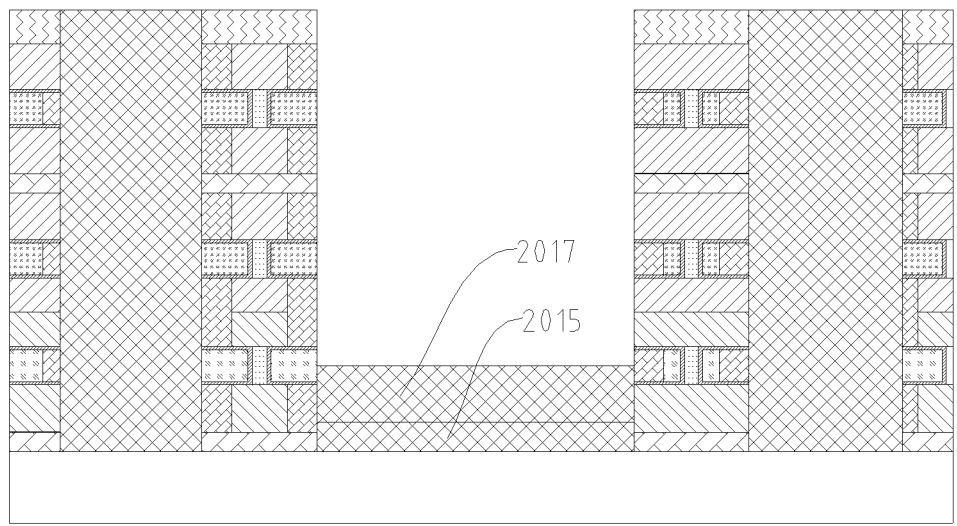
FIG. 23(b) shows a sectional view along line BB' formed according to FIG. 23(a).

FIG. 23(*a*) schematically shows a top view of a photoresist patterning region. FIG. 23(*b*) shows a sectional view along line BB' formed according to FIG. 23(*a*).

Then, as shown in FIG. 23 (*a*) and FIG. 23 (*b*), small rectangular boxes on upper and lower sides of section BB' are not covered by the photoresist, and belong to the exposed region of the substrate 1001, and other parts are covered with the photoresist PR. Moreover, the exposed region of the substrate 1001 just exposes the region between the left stack and the right stack of a single minimum SRAM memory unit.

The seventh $SiO_2$ layer 2017 is etched downward in the rectangular box regions on upper and lower sides of section BB', and the etching stops at a sixth preset height, and then the photoresist is removed. The sixth preset height is higher than the top of the first source/drain layer 10031 and lower than the bottom of the second source/drain layer 10071.

In order to reduce the series resistance and contact resistance of the active region, it is also necessary to form metal silicides on the active region, and a surface of the seventh $SiO_2$ layer 2017 is treated by the metal silicide process.

Figure 24:
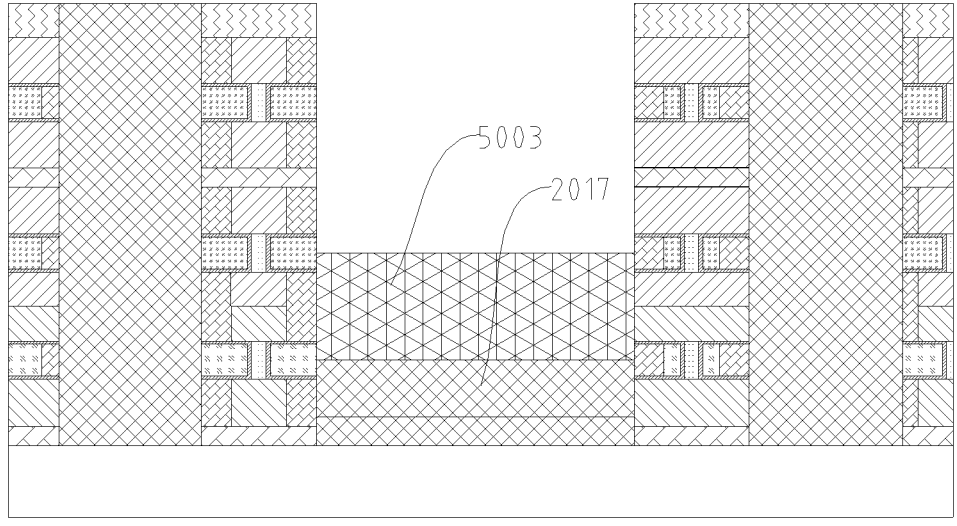

FIG. 24 schematically shows a sectional view along line BB'.

Next, as shown in FIG. 24, a third metal layer 5003 is deposited on the seventh $SiO_2$ layer 2017 of section BB', and the deposition of the third metal layer 5003 is controlled by CMP to stop on the upper surface of the hard mask layer 1009. Then, the third metal layer 5003 is etched downward, and the etching stops at a seventh preset height.

The seventh preset height is higher than the top of the first source/drain layer 10032 and lower than the bottom of the second source/drain layer 10072. It may be seen from FIG. 1 that the third metal layer 5003 may be used to connect an input node IN1 of the first CMOS with an output node OUT2 of the second CMOS, and connect an input node IN2 of the second CMOS with an output node OUT1 of the first CMOS.

Figure 25:
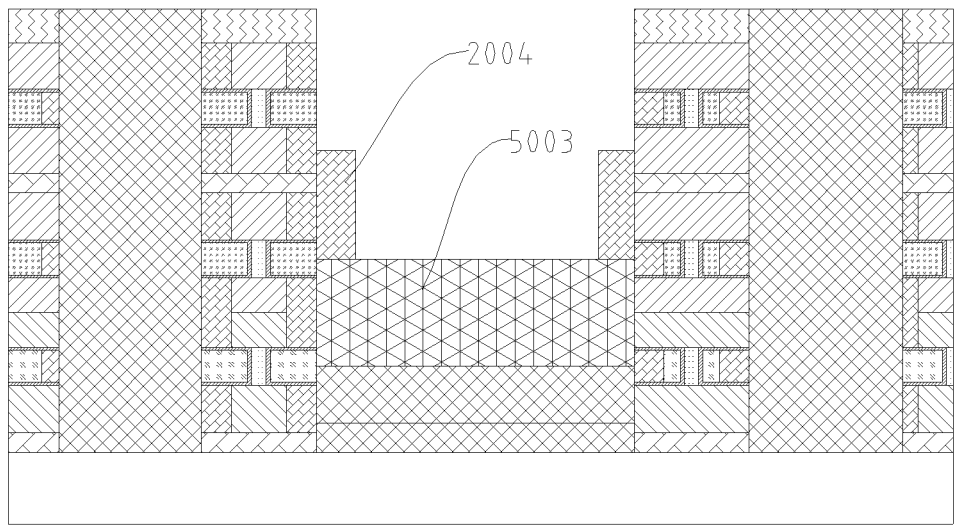

FIG. 25 schematically shows a sectional view along line BB'.

Next, as shown in FIG. 25, a fourth SiC layer 2004 is deposited on the third metal layer 5003 of section BB', and the deposition of the fourth SiC layer 2004 is controlled by CMP to stop on the upper surface of the hard mask layer 1009. Then, the fourth SiC layer 2004 is etched downward and the etching stops at an eighth preset height. The etching continues at a middle position of the top of the fourth SiC layer 2004 and stops on the upper surface of the third metal layer 5003 to form a left-right-separated second spacing portion having a stepped structure.

The eighth preset height is higher than the bottom of the first source/drain layer 10033 and lower than the top of the first source/drain layer 10033. Thus, the second spacing portion may isolate the n-type gate conductor layer 4003 in the first NMOS layer to avoid subsequent effects.

Figure 26:
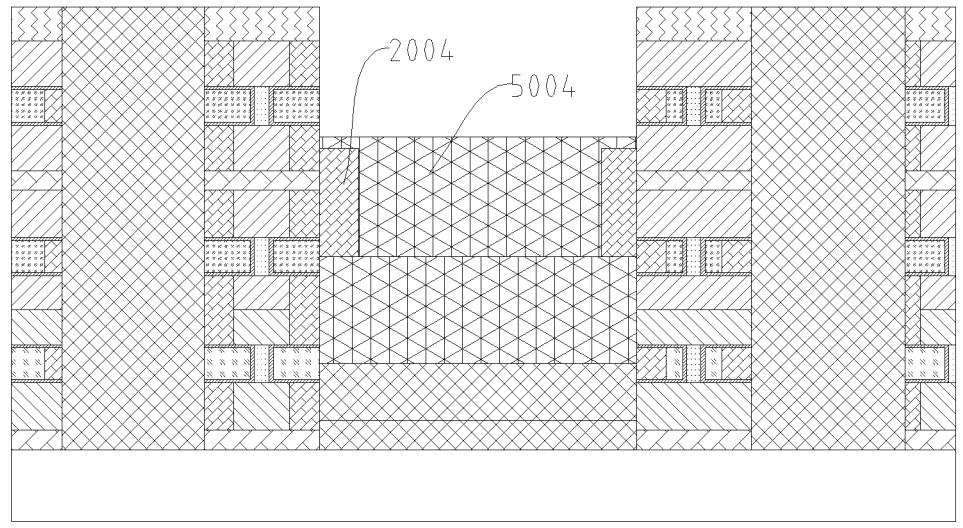

FIG. 26 schematically shows a sectional view along line BB'.

Then, as shown in FIG. 26, a fourth metal layer 5004 is deposited on an inner wall, a bottom surface and an upper surface of the second spacing portion of section BB', and the deposition of the fourth metal layer 5004 is controlled by CMP to stop on the upper surface of the hard mask layer 1009. Then, the fourth metal layer 5004 is etched downward and the etching stops at a ninth preset height.

The ninth preset height is higher than the bottom of the first source/drain layer 10033 and lower than the top of the first source/drain layer 10033. It may be seen from FIG. 1 that the fourth metal layer 5004 may be used to connect the input node IN1 of the first CMOS and the output node OUT2 of the second CMOS with the source electrode of the transistor M6, and connect the input node IN2 of the second CMOS and the output node OUT1 of the first CMOS with the source electrode of the transistor M5 at the same time.

Figure 27A:
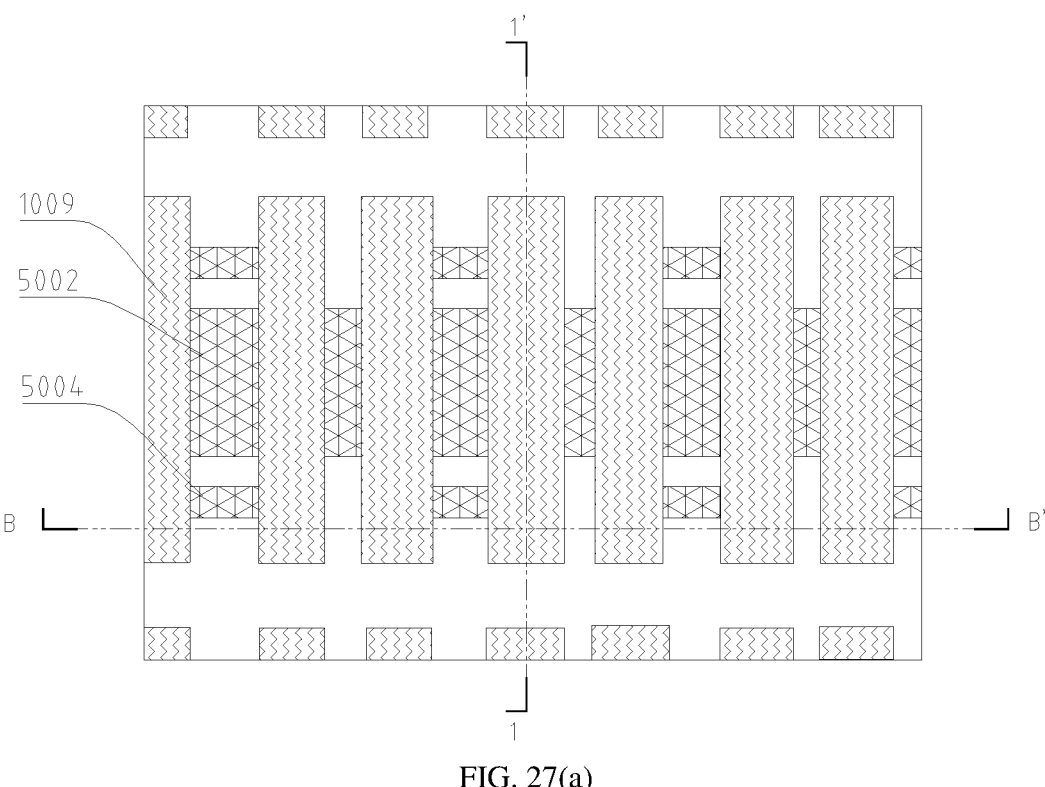
FIG. 27(a) schematically shows a top view of a photoresist patterning region.
Figure 27B:
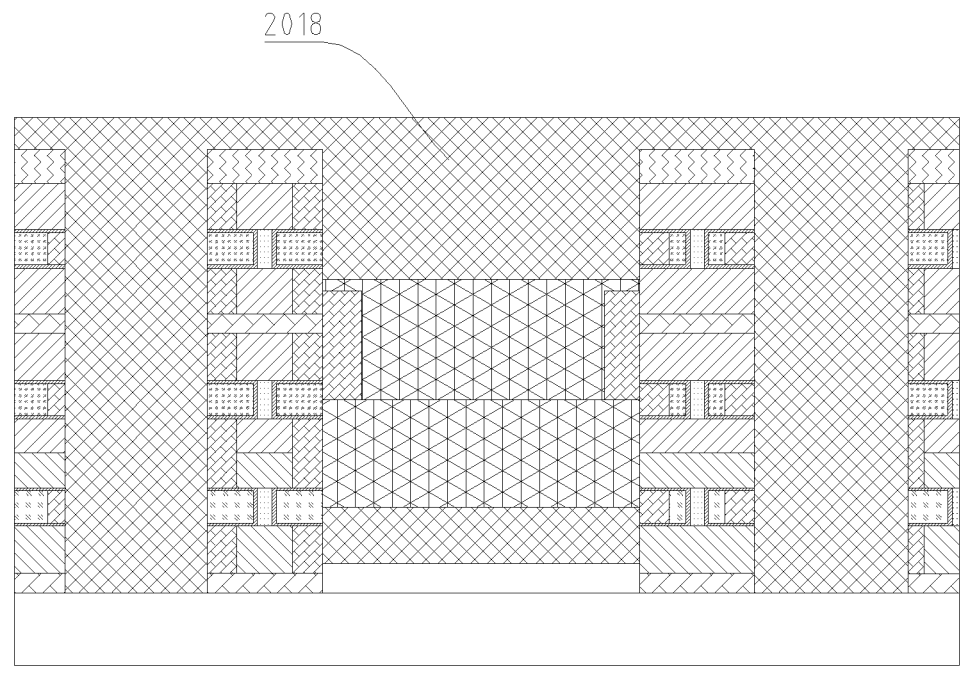
FIG. 27(b) shows a sectional view along line BB' formed according to FIG. 27(a).

FIG. 27(*a*) schematically shows a top view of a photoresist patterning region. FIG. 27(*b*) shows a sectional view along line BB' formed according to FIG. 27(*a*).

Then, as shown in FIG. 27(*a*) and FIG. 27(*b*), the photoresist is removed, and the eighth $SiO_2$ layer 2018 is deposited on all upper surfaces, so that the upper surfaces of all material layers are covered with the eighth $SiO_2$ layer 2018.

Figure 28A:
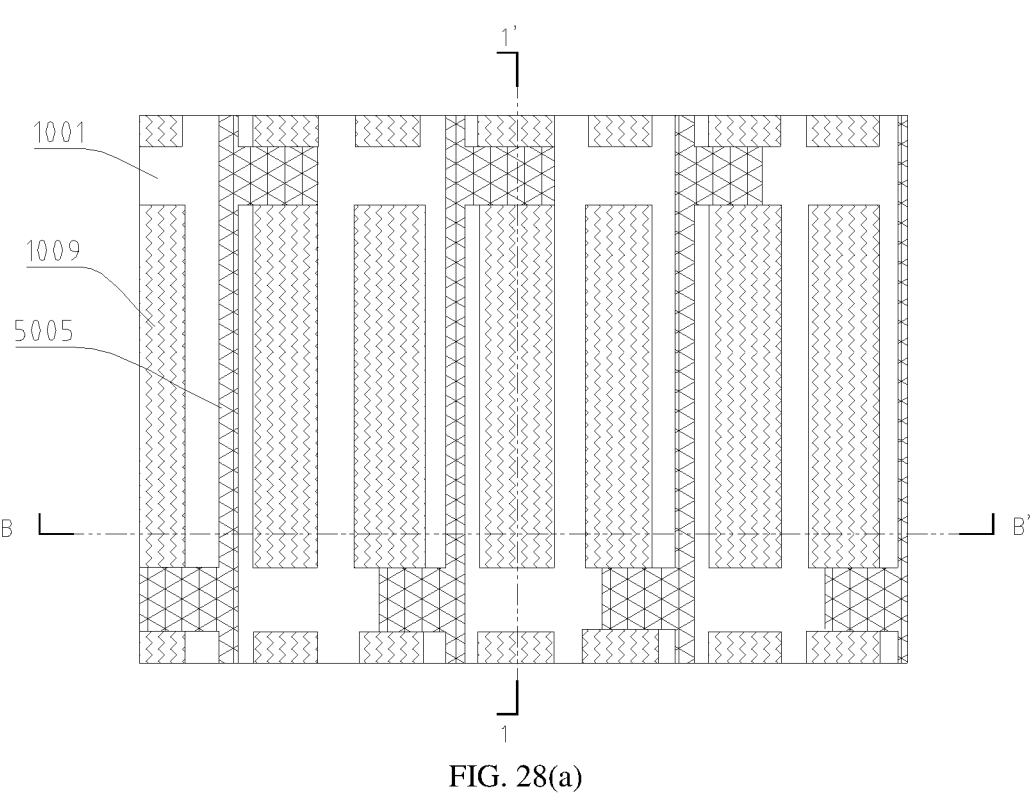
FIG. 28(a) schematically shows a top view of a photoresist patterning region.
Figure 28B:
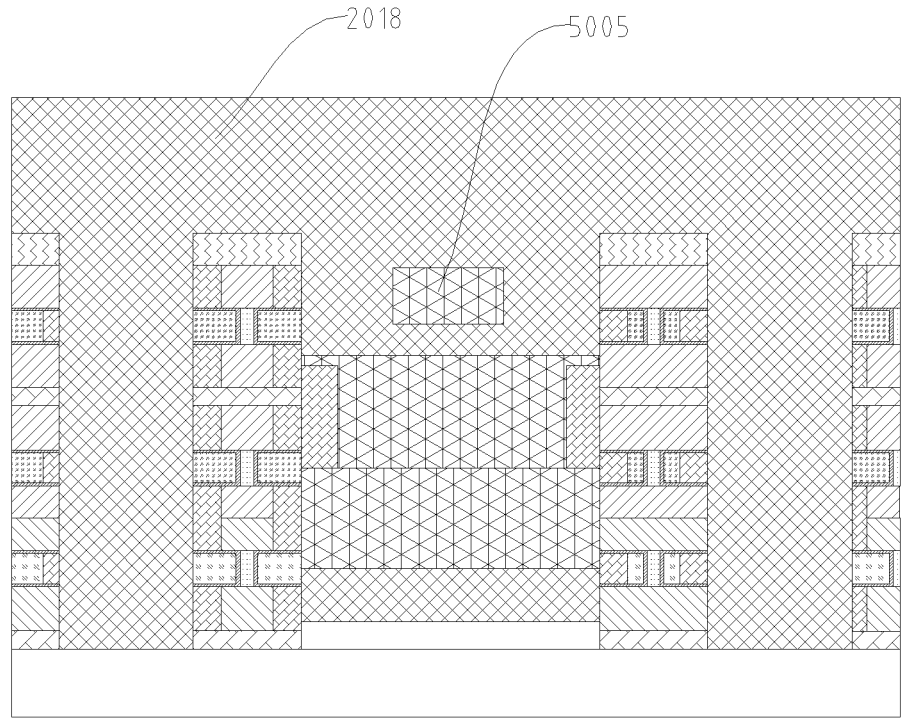
FIG. 28(b) shows a sectional view along line BB' formed according to FIG. 28(a)

FIG. 28(*a*) schematically shows a top view of a photoresist patterning region. FIG. 28(*b*) shows a sectional view along line BB' formed according to FIG. 28(*a*).

Then, as shown in FIG. 28 (*a*), the photoresist is spin-coated on the upper surface of the eighth $SiO_2$ layer 2018 (not shown in FIG. 28 (*a*)) to define a region shape of the word line WL. As shown in the top view, the word line WL bridges a front end face of the left stack and a rear end face of the right stack on the same memory unit. Using the patterned photoresist as the mask, the eighth $SiO_2$ layer 2018 is etched downward, and the etching stops at a tenth preset height. The tenth preset height is higher than the top of the first source/drain layer 10033 and lower than the bottom of the second source/drain layer 10073, so that the n-type gate conductor layer 4003 at the second NMOS layer is partially exposed.

Then, a fifth metal layer 5005 is deposited on an outer sidewall of the n-type gate conductor layer 4003 in the second NMOS layer, and the deposition of the fifth metal layer 5005 is controlled by CMP to stop on the upper surface of the hard mask layer 1009. Then, the fifth metal layer 5005 is etched downward and the etching stops at an eleventh preset height. The eleventh preset height is higher than the bottom of the second source/drain layer 10073 and lower than the top of the second source/drain layer 10073. At the same time, on the section BB', the fifth metal layer 5005 adjacent to an outer sidewall of the n-type gate conductor layer 4003 is partially etched, so that the etched fifth metal layer 5005 is isolated respectively from the outer sidewalls of the left stack and the right stacks which are arranged oppositely.

Therefore, as shown in FIG. 28 (*b*), on the section BB' in the horizontal direction, the n-type gate conductor layer 4003 in the second NMOS layer of the left stack does not contact the fifth metal layer 5005, and the n-type gate conductor layer 4003 in the second NMOS layer of the right stack also does not contact the fifth metal layer 5005, thus forming a ladder-like connection line.

It may be seen from FIG. 1 that the fifth metal layer 5005 may be used to define the word line WL, so that the word line WL bridges the front end face of the left stack and the rear end face of the right stack on the same memory unit to contact and electrically connect to an outer sidewall of the n-gate conductor layer 4003 in the second NMOS layer of the front end face of the left stack or the rear end face of the right stack.

Figure 29:
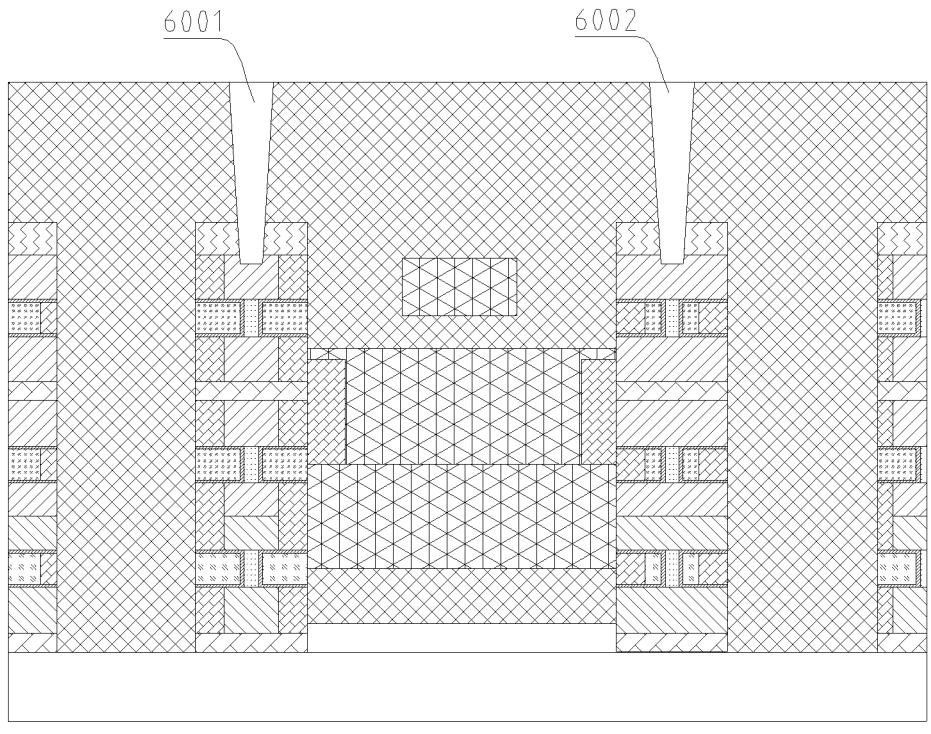

FIG. 29 schematically shows a sectional view along line BB'.

Next, as shown in FIG. 29, metal contact portions are formed on the second source/drain layer 10073 of the left stack and the right stack respectively. It may be seen from FIG. 1 that the metal contact portion may be used to form a bit line BL and a bit line $\overline{BL}$ having opposite signals to each other.

Specifically, the metal contact portion includes: a first contact portion 6001 of the second source/drain layer 10073 embedded in the left stack, and a second contact portion 6002 of the second source/drain layer 10073 embedded in the right stack. The first contact portion 6001, for example, may be connected with the bit line BL, and accordingly, the second contact portion 6002, for example, may be connected with the bit line $\overline{BL}$.

19                                              20

The metal contact portion may be formed by a conventional process. For example, the metal contact portion may be formed by etching a hole in the hard mask layer 1009 and the second source/drain layer 10073 sequentially, and filling the hole with a conductive material such as a metal.

Thus, the memory device of embodiments of the present disclosure is manufactured. The memory device takes a 6T SRAM unit as the minimum memory unit, has fewer transistors, simplifies a storage and processing structure of a computer, saves a computing resource, and improves a computing progress and a computing efficiency simultaneously.

Compared with the related art, the memory device and the method of manufacturing the same provided in the present disclosure have at least following beneficial effects: the memory device takes a 6T SRAM unit as the minimum memory unit, has fewer transistors, simplifies a storage and processing structure of a computer, saves a computing resource, and improves a computing progress and a computing efficiency simultaneously.

In addition, for a vertical stack of a semiconductor device, a sidewall interconnection structure adjacent to the vertical stack may be provided. For several layers of devices, one mask layer may be used, thus photolithography steps in a manufacturing process may be reduced and a manufacturing cost may be reduced. In addition, a three-dimensional structure enables an interconnection between devices to have more space, and thus may have a low resistance and a high bandwidth. Due to the existence of the sidewall interconnection structure, the semiconductor device may have a leading-out terminal, thus a manufacturing of the semiconductor device may be separated from a manufacturing of a metallized stack.

The memory device according to embodiments of the present disclosure may be applied to various electronic devicees. For example, the electronic device may include the memory device and a processor. The memory device may store data required for an operation of the electronic device or data obtained during an operation. The processor may operate based on data and/or applications stored in the memory device. The electronic device may include, for example, a smart phone, a personal computer (PC), a tablet computer, a wearable device, an artificial intelligence device, a portable power source, and so on.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

Embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A memory device, comprising:
   a substrate;

a memory unit array on the substrate, wherein the memory unit array comprises a plurality of memory units, wherein each of the memory units comprises:

a left stack and a right stack arranged at an interval in a horizontal direction, wherein each of the left stack and the right stack comprises a lower isolation layer, a PMOS (positive channel metal oxide semiconductor) layer, a first NMOS (negative channel metal oxide semiconductor) layer, an upper isolation layer and a second NMOS layer stacked on the substrate sequentially, each of the PMOS layer, the first NMOS layer and the second NMOS layer comprises a first source/drain layer, a channel layer and a second source/drain layer vertically stacked, and the channel layer is laterally recessed with respect to the first source/drain layer and the second source/drain layer; and a gate stack between the first source/drain layer and the second source/drain layer in a vertical direction, and disposed on opposite sides of the channel layer to be embedded into a lateral recess of the channel layer.

2. The memory device of claim 1, further comprising:
a hard mask layer disposed on the first source/drain layer of the second NMOS layer.

3. The memory device according to claim 1, wherein the gate stack comprises a gate dielectric layer and a gate conductor layer, and the gate dielectric layer comprises a work function adjusting metal and a gate conductor metal disposed on the work function adjusting metal.

4. The memory device according to claim 3, wherein the gate conductor layer comprises a p-type gate conductor layer and an n-type gate conductor layer, wherein,
   the p-type gate conductor layer is disposed between the first source/drain layer and the second source/drain layer of the PMOS layer;
   the n-type gate conductor layer is disposed between the first source/drain layer and the second source/drain layer of the first NMOS layer, and between the first source/drain layer and the second source/drain layer of the second NMOS layer.

5. The memory device according to claim 3, wherein lateral outer peripheral parts of the first source/drain layer and the second source/drain layer are recessed and the recessed parts are filled with a third SiC layer; and/or
   a lateral outer peripheral part of the gate conductor layer is recessed and the recessed part is filled with a third SiC layer.

6. The memory device according to claim 5, wherein an outer sidewall of the third SiC layer is coplanar with the left stack and the right stack in the vertical direction.

7. The memory device according to claim 1, further comprising:
   a fifth $SiO_2$ layer formed on the substrate between the left stack and the right stack, wherein a top of the fifth $SiO_2$ layer is higher than a bottom of the first source/drain layer of the PMOS layer and lower than a top of the first source/drain layer of the PMOS layer.

8. The memory device according to claim 7, further comprising:
   a first metal layer formed on the fifth $SiO_2$ layer at a longitudinal middle position of the left stack and the right stack, wherein a top of the first metal layer is higher than a top of the first source/drain of the PMOS layer and lower than a bottom of the second source/drain layer of the PMOS layer.

9. The memory device according to claim 8, further comprising:

a sixth $SiO_2$ layer and a second metal layer sequentially formed on the first metal layer, wherein a top of the sixth $SiO_2$ layer is higher than a top of the first source/drain layer of the first NMOS layer and lower than a bottom of the second source/drain layer of the first NMOS layer; and a top of the second metal layer is higher than a bottom of the second source/drain layer of the first NMOS layer and lower than a top of the second source/drain layer of the first NMOS layer.

10. The memory device according to claim 8, further comprising:

a seventh $SiO_2$ layer formed on the fifth $SiO_2$ layer except the longitudinal middle position, wherein a top of the seventh $SiO_2$ layer is higher than the top of the first source/drain layer of the PMOS layer and lower than the bottom of the second source/drain layer of the PMOS layer.

11. The memory device according to claim 10, further comprising:

a third metal layer formed on the seventh $SiO_2$ layer, wherein a top of the third metal layer is higher than a top of the first source/drain layer of the first NMOS layer and lower than a bottom of the second source/drain layer of the first NMOS layer.

12. The memory device according to claim 11, further comprising:

a fourth SiC layer formed on the third metal layer, wherein a top of the fourth SiC layer is higher than a bottom of the first source/drain layer of the second NMOS layer and lower than a top of the first source/drain layer of the second NMOS layer, wherein a middle position of the top of the fourth SiC layer is relatively recessed and the third metal layer is exposed, so as to form a second spacing portion separated left and right and having a stepped structure.

13. The memory device according to claim 12, wherein an inner sidewall and a bottom surface of the second spacing portion are formed with a fourth metal layer higher than the top of the fourth SiC layer, and wherein a top of the fourth metal layer is higher than a bottom of the first source/drain layer of the second NMOS layer and lower than a top of the first source/drain layer of the second NMOS layer.

14. The memory device according to claim 4, further comprising:

a fifth metal layer formed on a front end surface of the left stack and a rear end surface of the right stack, and in contact with an outer sidewall of the n-type gate conductor layer in the second NMOS layer;

a word line connected to the fifth metal layer, wherein the word line is configured to bridge the front end surface of the left stack and the rear end surface of the right stack of a same memory unit to contact and electrically connect to an outer sidewall of the n-type gate conductor layer in the second NMOS layer of the left stack or the right stack.

15. The memory device according to claim 1, further comprising:

a first contact portion embedded in the second source/drain layer of the second NMOS layer of the left stack, and a second contact portion embedded in the second source/drain layer of the second NMOS layer of the right stack, wherein the first contact portion and the second contact portion are respectively connected to a first bit line and a second bit line having opposite signals to each other.

16. An electronic device, comprising the memory device according to claim 1.

17. The electronic device according to claim 16, wherein the electronic device comprises a smart phone, a computer, a tablet computer, a wearable smart device, an artificial intelligence device, and a portable power source.

\* \* \* \* \*